(12) United States Patent
Pfeiffer et al.

(10) Patent No.: US 7,986,090 B2
(45) Date of Patent: Jul. 26, 2011

(54) LIGHT-EMITTING COMPONENT

(75) Inventors: Martin Pfeiffer, Dresden (DE); Gregor Schwartz, Dresden (DE); Sven Murano, Dresden (DE); Jan Birnstock, Dresden (DE)

(73) Assignee: Novaled AG, Dresden (DE)

( * ) Notice: Subject to any disclaimer, the term of this patent is extended or adjusted under 35 U.S.C. 154(b) by 568 days.

(21) Appl. No.: 11/908,632

(22) PCT Filed: Feb. 22, 2006

(86) PCT No.: PCT/DE2006/000328
§ 371 (c)(1),
(2), (4) Date: Dec. 3, 2007

(87) PCT Pub. No.: WO2006/097064
PCT Pub. Date: Sep. 21, 2006

(65) Prior Publication Data
US 2009/0230844 A1    Sep. 17, 2009

(30) Foreign Application Priority Data
Mar. 15, 2005  (EP) .................................... 05005573

(51) Int. Cl.
*H01J 1/62* (2006.01)
*H01J 63/04* (2006.01)
(52) U.S. Cl. ........................................ 313/504; 313/506
(58) Field of Classification Search .................. 313/504, 313/506; 428/690
See application file for complete search history.

(56) References Cited

U.S. PATENT DOCUMENTS 4,356,429 A    10/1982 Tang
(Continued)

FOREIGN PATENT DOCUMENTS

CA    2549309    9/2005
(Continued)

OTHER PUBLICATIONS

Adachi, C. et al., "Efficient electrophosphorescence using a doped ambipolar conductive molecular organic thin film," Organic Electronics 2, (2001), pp. 37-43.
(Continued)

*Primary Examiner* — Nimeshkumar D Patel
*Assistant Examiner* — Glenn Zimmerman
(74) *Attorney, Agent, or Firm* — Sutherland, Asbill & Brennan, LLP

(57) ABSTRACT

The invention relates to a light-emitting component, in particular organic light-emitting diode, having an electrode and a counterelectrode and an organic region—arranged between the electrode and the counterelectrode—with a light-emitting organic region, which comprises an emission layer and a further emission layer and which, upon application of an electrical voltage to the electrode and the counterelectrode, is formed in a manner emitting light in a plurality of colour ranges in the visible spectral range, optionally through to white light, in which case the emission layer comprises a fluorescent emitter which emits light predominantly in the blue or in the blue-green spectral range; the further emission layer comprises one or a plurality of phosphorescent emitters emitting light predominantly in the non-blue spectral range; a triplet energy for an energy level of a triplet state of the fluorescent emitter in the emission layer is greater than a triplet energy for an energy level of a triplet state of the phosphorescent emitter in the further emission layer; and an at least 5% proportion of the light generated in the light-emitting organic region is formed in the visible spectral range as fluorescent light from singlet states of the fluorescent emitter in the emission layer.

25 Claims, 8 Drawing Sheets

U.S. PATENT DOCUMENTS

| | | |
|---|---|---|
| 4,769,292 A | 9/1988 | Tang et al. |
| 5,093,698 A | 3/1992 | Egusa |
| 5,500,537 A | 3/1996 | Tsumura et al. |
| 5,703,436 A | 12/1997 | Forrest et al. |
| 5,757,026 A | 5/1998 | Forrest et al. |
| 5,811,833 A | 9/1998 | Thompson |
| 5,840,217 A | 11/1998 | Lupo et al. |
| 5,917,280 A | 6/1999 | Burrows et al. |
| 5,969,474 A | 10/1999 | Aria |
| 5,989,785 A | 11/1999 | Ishihara et al. |
| 6,023,073 A | 2/2000 | Strite |
| 6,107,734 A | 8/2000 | Tanaka et al. |
| 6,274,980 B1 | 8/2001 | Burrows et al. |
| 6,303,238 B1 | 10/2001 | Thompson et al. |
| 6,310,360 B1 | 10/2001 | Forrest et al. |
| 6,337,492 B1 | 1/2002 | Jones et al. |
| 6,406,804 B1 | 6/2002 | Higashi |
| 6,437,769 B1 | 8/2002 | Kohayashi |
| 6,555,840 B1 | 4/2003 | Hudson et al. |
| 6,566,807 B1 | 5/2003 | Fujita et al. |
| 6,573,651 B2 | 6/2003 | Adachi et al. |
| 6,579,422 B1 | 6/2003 | Kasinuma |
| 6,580,027 B2 | 6/2003 | Forrest et al. |
| 6,589,673 B1 | 7/2003 | Kido et al. |
| 6,645,645 B1 | 11/2003 | Adachi et al. |
| 6,720,573 B2 | 4/2004 | Son |
| 6,734,457 B2 | 5/2004 | Yamazaki |
| 6,835,470 B1 | 12/2004 | Magain |
| 6,867,538 B2 | 3/2005 | Adachi et al. |
| 6,878,297 B1 | 4/2005 | Berger |
| 6,897,473 B1 | 5/2005 | Burroughes et al. |
| 6,900,588 B2 | 5/2005 | Adachi et al. |
| 6,908,783 B1 | 6/2005 | Kuehl et al. |
| 6,911,666 B2 | 6/2005 | Voutsas et al. |
| 6,933,522 B2 | 8/2005 | Lin |
| 6,936,961 B2 | 8/2005 | Liao et al. |
| 6,965,197 B2 | 11/2005 | Tyan |
| 6,979,414 B2 | 12/2005 | Hosokawa et al. |
| 7,001,536 B2 | 2/2006 | Thompson et al. |
| 7,074,500 B2 | 7/2006 | Pfeiffer |
| 7,161,292 B2 | 1/2007 | Leo |
| 7,301,167 B2 | 11/2007 | Ko |
| 7,473,410 B1 | 1/2009 | Huffman et al. |
| 2001/0033136 A1 | 10/2001 | Kawase |
| 2002/0030440 A1 | 3/2002 | Yamazaki |
| 2002/0041975 A1 | 4/2002 | Ueda et al. |
| 2002/0048688 A1 | 4/2002 | Fukuoka et al. |
| 2002/0071082 A1 | 6/2002 | Okita et al. |
| 2002/0084993 A1 | 7/2002 | Teneya |
| 2002/0098379 A1 | 7/2002 | Arakane |
| 2002/0109136 A1 | 8/2002 | Seo et al. |
| 2002/0146589 A1* | 10/2002 | Akiyama et al. ............ 428/690 |
| 2003/0020073 A1 | 1/2003 | Long et al. |
| 2003/0042848 A1 | 3/2003 | Park et al. |
| 2003/0052616 A1 | 3/2003 | Antoniadis et al. |
| 2003/0098946 A1 | 5/2003 | Blaessing et al. |
| 2003/0127973 A1 | 7/2003 | Weaver et al. |
| 2003/0146443 A1 | 8/2003 | Yamazaki et al. |
| 2003/0170491 A1 | 9/2003 | Liao et al. |
| 2003/0178619 A1 | 9/2003 | Forrest et al. |
| 2003/0189401 A1 | 10/2003 | Kido et al. |
| 2003/0230980 A1 | 12/2003 | Forrest et al. |
| 2004/0012980 A1 | 1/2004 | Sigiura et al. |
| 2004/0032220 A1 | 2/2004 | Cok et al. |
| 2004/0062949 A1* | 4/2004 | Pfeiffer et al. ............. 428/690 |
| 2004/0067324 A1 | 4/2004 | Lazarev et al. |
| 2004/0104394 A1 | 6/2004 | Lin et al. |
| 2004/0113547 A1 | 6/2004 | Son |
| 2004/0119400 A1 | 6/2004 | Takahashi et al. |
| 2004/0150330 A1 | 8/2004 | Suh et al. |
| 2004/0183067 A1 | 9/2004 | Strip et al. |
| 2004/0191952 A1 | 9/2004 | Shtein et al. |
| 2004/0201018 A1 | 10/2004 | Yamahara et al. |
| 2004/0214041 A1 | 10/2004 | Lu |
| 2004/0227460 A1 | 11/2004 | Liao et al. |
| 2004/0235209 A1 | 11/2004 | Hasegawa et al. |
| 2004/0251816 A1* | 12/2004 | Leo et al. ............... 313/504 |
| 2005/0029933 A1 | 2/2005 | Liao et al. |
| 2005/0040390 A1 | 2/2005 | Pfeiffer et al. |
| 2005/0040392 A1 | 2/2005 | Wu et al. |
| 2005/0053801 A1 | 3/2005 | Eischner et al. |
| 2005/0061232 A1 | 3/2005 | Werner et al. |
| 2005/0073251 A1 | 4/2005 | Kato |
| 2005/0077817 A1 | 4/2005 | Satoshi et al. |
| 2005/0086251 A1 | 4/2005 | Hatscher et al. |
| 2005/0095736 A1 | 5/2005 | Padiyath et al. |
| 2005/0110009 A1 | 5/2005 | Blochwitz-Nimoth et al. |
| 2005/0118745 A1 | 6/2005 | Yamazaki et al. |
| 2005/0123794 A1* | 6/2005 | Deaton et al. ............. 428/690 |
| 2005/0142383 A1* | 6/2005 | Igarashi et al. ............ 428/690 |
| 2005/0173700 A1 | 8/2005 | Liao et al. |
| 2005/0189875 A1 | 9/2005 | Nakada |
| 2005/0218797 A1 | 10/2005 | Bechtel et al. |
| 2005/0255334 A1 | 11/2005 | Kang et al. |
| 2005/0269943 A1 | 12/2005 | Hack et al. |
| 2005/0270279 A1 | 12/2005 | Giraldo et al. |
| 2006/0019116 A1* | 1/2006 | Conley et al. ............. 428/690 |
| 2006/0033115 A1 | 2/2006 | Blochwitz et al. |
| 2006/0038170 A1 | 2/2006 | Brunschwiler et al. |
| 2006/0061266 A1 | 3/2006 | Kang et al. |
| 2006/0065904 A1 | 3/2006 | Uemura et al. |
| 2006/0145365 A1 | 7/2006 | Halls et al. |
| 2006/0202196 A1 | 9/2006 | Kawakami et al. |
| 2006/0231843 A1 | 10/2006 | Qin et al. |
| 2006/0232992 A1 | 10/2006 | Bertram et al. |
| 2006/0238112 A1 | 10/2006 | Kasama et al. |
| 2006/0250076 A1 | 11/2006 | Hofmann et al. |
| 2006/0273310 A1 | 12/2006 | Birnstock et al. |
| 2007/0034860 A1 | 2/2007 | Nakamura et al. |
| 2007/0051946 A1 | 3/2007 | Walzer et al. |
| 2007/0278479 A1 | 12/2007 | Werner et al. |
| 2008/0143250 A1 | 6/2008 | Blochwitz-Nimoth et al. |
| 2008/0164807 A1 | 7/2008 | Hofmann et al. |
| 2008/0203406 A1 | 8/2008 | He et al. |
| 2009/0009071 A1 | 1/2009 | Murano et al. |
| 2009/0009072 A1 | 1/2009 | Wellmann et al. |

FOREIGN PATENT DOCUMENTS

| | | |
|---|---|---|
| CN | 1543659 | 11/2004 |
| DE | 19916745 | 10/2000 |
| DE | 10209789 | 9/2003 |
| DE | 10229231 | 1/2004 |
| EP | 1227466 | 7/2002 |
| EP | 1282101 | 2/2003 |
| EP | 1318499 | 6/2003 |
| GB | 2361356 | 10/2001 |
| GB | 2388236 | 11/2003 |
| GB | 2390215 | 12/2003 |
| GB | 2392023 | 2/2004 |
| JP | 5931865 | 2/1984 |
| JP | 03208689 | 9/1991 |
| JP | 07-142169 | 11/1993 |
| JP | 05-034692 | 12/1993 |
| JP | 11283750 | 10/1999 |
| JP | 2000-231992 | 8/2000 |
| JP | 2003203769 | 7/2003 |
| JP | 2003297561 | 10/2003 |
| JP | 2004119197 | 4/2004 |
| JP | 2004-152700 | 5/2004 |
| JP | 2004214120 | 7/2004 |
| JP | 2004-227814 | 8/2004 |
| JP | 2004234942 | 8/2004 |
| JP | 2005156925 | 6/2005 |
| KR | 0522687 | 10/2005 |
| TW | 200401017 | 1/2004 |
| WO | WO 99/48160 | 9/1999 |
| WO | WO 01/27910 | 4/2001 |
| WO | WO 02/37580 | 5/2002 |
| WO | WO 02/093664 | 11/2002 |
| WO | WO 03012890 A2 * | 2/2003 |
| WO | WO 03/069958 | 8/2003 |
| WO | WO 03/088271 | 10/2003 |
| WO | 03/100800 | 12/2003 |
| WO | WO 2004/025615 | 3/2004 |
| WO | 2004/060026 | 7/2004 |
| WO | WO 2004/059606 | 7/2004 |

| | | |
|---|---|---|
| WO | WO 2004/097954 | 11/2004 |
| WO | WO 2005/008801 | 1/2005 |
| WO | WO 2005/089288 | 9/2005 |

OTHER PUBLICATIONS

Adachi, C. et al., "High-efficiency organic electrophorescent devices with tris (2-phenylpyridine) iridium doped into electron-transporting materials," App. Phys. Lett. vol. 77, No. 6, Aug. 7, 2000.

Adachi, C. et al., "Nearly 100% internal phosphorescence efficiency in an organic light emitting device," Journal of Applied Physics (2001), vol. 90:10, pp. 5048-5051.

Adachi, et al. "Electroluminescence in Organic Films with Three-Layer Structure," Japanese Journal of Applied Physics, 27, L269 (1988).

Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).

Ammermann, D. et al., "Photonic devices based on crystalline organic semiconductors for optoelectronic integrated circuits," Jps. J. Appl. Phys. Pt. 1 (1995) vol. 34, pp. 1293-1297.

Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.

Baldo, M. A. et al., "High efficiency fluorescent organic light-emitting devices using a phosphorescent sensitizer," Nature, (2000), vol. 403, pp. 750-753.

Baldo, M. A. et al., "Transient analysis of organic electrophosphorescence: I. Transient analysis of triplet energy transfer," Physical Review B, (2000), vol. 62:16, pp. 10958-10966.

Baldo, M. A., et al., "Transient analysis of organic electrophosphorescence II. Transient analysis of triplet-triplet annihilation," Physical Review B, (2000), vol. 62:16, pp. 10967-10977.

Baldo, M., et al., "Organic vapor phase deposition," Advanced Materials, 1998, 10, No. 18, pp. 1505-1514.

Bandyopadhyay, A, et al al. "Large conductance switching and memory effects in organic molecules for data-storage applications," Appl. Phys. Lett. 82, 1215 (2003).

Bard, A. J., Faulkner, R.J., Electrochemical Methods: Fundamentals and Applications, Wiley, 2nd Ed., 2000 (Chapter 2).

Bard, A. J., Faulkner, R.J., Electrochemical Methods: Fundamentals and Applications, Wiley, 2nd Ed., 2000 (Chapter 6).

Bastard, G., "Wave mechanics applied to semiconductor heterostructures," The Editions of Physique, (1988) pp. 64-67.

Baumgartel, H. et al. "Intracluster Electron and Proton Transfer in Ionic Ortho-Xylene/Dimethylamine Aggregates," Ber Bunsenges. Phys. Chem. 101, 783-788 (1997) No. 5.

Baumgartel, H. et al., "Polarographische Untersuchungen zur Konformation von 1.2.3.4.5-pentaarylimidazoliumkationen," Ber. Bunsenges (1972) 76/2, 94-100.

Bernanose, Andre et al. "Sur un nouvea mode d'emission lumineuse chez certains composes organiques," J. de Chimie Physique, 1953, No. 1, pp. 64-68.

Birnstock, J. et al., "High Efficiency Top Emitting OLEDs on a-Si Active Matrix Backplanes with Large Aperture Ratio," OLED1: Panel, IDW '04, Dec. 8, 2004.

Blochwitz, J. "Organic Light-Emitting Diodes with Doped Charge Transport Layers" Dissertation: Technische Universitat Dresden (2001). http://deposit.ddb.de/cgi-bin/dokserv?idn=963580051&dok_var=d1&dok_ext=pdf&filename=963580051.pdf.

Blochwitz, J. et al., "Interface electronic structure of organic semiconductors with controlled doping levels," Org. Electronics 2, 97 (2001).

Blochwitz, J., et al., "Low voltage organic light emitting diodes featuring doped phthalocyanine as hole transport material," Applied Physics Letters, vol. 73, No. 6, Aug. 10, 1998, pp. 729-731.

Blochwitz, J., et al., "Non-polymeric OLEDs with a doped amorphous hole transport layer and operating voltages down to 3.2 V to achieve 100 cd/m$^2$," Synthetic Metals, (2002), vol. 127, pp. 169-173.

Bloom, C. J. et al., "Low work function reduced metal complexes as cathodes in organic electroluminescent devices," J. of Phyiscal Chemistry B, vol. 107, No. 13, pp. 2933-2938.

Campbell, A. J. et al., "Dispersive electron transport in an electroluminescent polyfluorene copolymer measured by the current integration time of flight method," Applied Physics Letters, Oct. 1, 2001, vol. 79, No. 14 pp. 2133-2135.

Carter, S. A. et al., "Enhanced luminance in polymer composite light emitting devices," Appl. Phys. Lett., vol. 71, pp. 1145-1147, Sep. 1997.

Chung-Chih, Wu et al., "Efficient organic blue-light-emitting devices with double confinement on terfluorenes with ambipolar carrier transport properties," Advanced Materials, Jan. 5, 2004, vol. 16, No. 1, pp. 61-65.

Colle, M. et al. "Switching and filamentary conduction in non-volatile organic memories," Organic Electronics, 7, 305-312 (Oct. 2006).

Connelly, N. G. et al., "Chemical Redox Agents for Organometallic Chemistry," Chem. Rev., 96, 877 (1996).

Cotton, F. et al., "Closed-shell molecules that ionize more readily than cesium," Science, vol. 298, No. 5600, pp. 1971-1974 (Dec. 6, 2002).

D'Andrade, B.W. et al., "Relationship between the ionization and oxidation potentials of molecular organic semiconductors," Organic Electronics 6, 2005, pp. 11-20.

D'Andrade, Brian W., "Operational stability of electrophosphorescent devices containing p and n doped transport layers," Applied Physics Letters, vol. 83, No. 19, Nov. 10, 2003, pp. 3858-3860.

D'Andrade, Brian W., et al., "High-efficiency yellow double-doped organic light-emitting devices based on phosphorsensitized fluorescence," Appl. Phys. Lett., (2001), vol. 79:7, pp. 1045-1047.

Day et al. "The use of charge transfer interlayers to control hole injection in molecular organic light-emitting diodes," Thin Solid Films, 410 (2002) pp. 159-166.

Dodabalapur et al., "Organic transistors: Two-dimensional transport and improved electrical characteristics," Science, vol. 268, p. 270 (1995).

Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.

Feng, X.D. et al. "Ohmic Cathode for Low-Voltage Organic Light-Emitting Diodes," App. Phys. Lett., vol. 86, Article 143511 (Apr. 1, 2005): pp. 1-3.

Gao, W. et al., "Effect of electrical doping on molecular level alignment at organic-organic heterojunctions," Applied Physics Letters, vol. 82, No. 26, Jun. 30, 2003, pp. 4815-4817.

Gu, G. et al., "Transparent organic light emitting devices," Applied Physics Letters, (1996), vol. 68:19, pp. 2606-2608.

Gu, G., et al. "Transparent stacked organic light emitting devices. I. Design principles and transparent compound electrodes," Journal of Applied Physics, 1999, vol. 86, No. 8, pp. 4067-4075.

Gufeng, et al., "Very high-efficiency and low voltage phosphorescent organic light-emitting diodes based on a p-i-n. junction," Journal of Applied Physics, vol. 95, No. 10, pp. 5773-5777 (May 15, 2004).

Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Hack, M. et al. "Status and Opportunities for High Efficiency OLED Displays on Flexible Substrates," Mater. Res. Soc. Symp. Proc., vol. 870E, Article H3.1, Symposium H Giant Area Electronics on Nonconventional Substrates (Mar. 28-Apr. 1, 2005): pp. 1-10.

Harada, K. et al. "Ionized impurity scattering in n-doped C60 thin films," Applied Physics Letters, 91, 092118 (2007).

Harada, K. et al. "Organic Homojunction Diodes with a High Built-in Potential: Interpretation of the Current-Voltage Characteristics by a Generalized Einstein Relation," Phys. Rev. Lett. 94, 036601 (2005).

Higgins, R.W.T. et al. "Emeraldine base polyaniline as an alternative to poly(3,4-ethylenedioxythiophene) as a hole-transporting layer," Advanced Functional Materials, 11, 407-412 (Dec. 1, 2001).

Hino, Yuichi et al., "Efficient low molecule phosphorescent organic light emitting diodes fabricated by wet-processing," Organic Electronics, Aug. 8, 2004, vol. 5, pp. 265-270.

Hong, Il-Hwa et al. "Effective hole injection of organic light-emitting diodes by introducing buckminsterfullerene on the indium tin oxide anode," Applied Physics Letters, 2005, 87, 063502-1.

Hu, Wenping et al., "Efficient red electroluminescence from devices having multilayers of a europium complex," Appl. Phys. Lett. vol. 77, No. 26, Dec. 25, 2000.

Huang, Jingsong et al., "Effect of well number on organic multiple-quantum-well electroluminescent device characteristics," Applied Physics Letters, (1998), vol. 73:23, pp. 3348-3350.

Huang, Jingsong et al., "Influence of the thickness and doping of the emission layer on the performance of organic light-emitting diodes with PiN structures," Journal of Applied Physics, (2003), vol. 93:2, pp. 838-844.

Huang, Jingsong et al., "Low operating voltage and high-efficiency organic multilayer electroluminescent devices with p-type doped hole injection layer," Jps. J. Appl. Phys., (2001), vol. 40, pp. 6630-6633.

Huang, Jingsong et al., "Low-voltage organic electroluminescent devices using pin structures," Applied Physics Letters, vol. 80, No. 1, Jan. 7, 2002, pp. 139-141.

Hughes, et al. "Electron transporting materials for organic electroluminescent and electrophosphorescent devices," Journal of Materials Chemistry (2005), vol. 15, pp. 94-107.

Hung, L.S. et al., "Recent progress of molecular organic electroluminescent materials and devices," Materials Science and Engineering Reports, 39, 2002, pp. 143-222.

Ikai, M. et al., "Highly Efficient Phosphorescence From Organic light-emitting devices with an exciton-block layer," Appl. Phys. Lett. vol. 79, No. 2, Jul. 9, 2001.

Ioannidis, A. et al., "Hole and electron transport in chloroaluminum phtalocyanin thin films," The Journal of Physical Chemistry B, 1997, vol. 101, pp. 5100-5107.

Ishii, M. et al., "Improvement of organic electroluminescent device performance by in situ plasma treatment of indium-tin-oxide surface," J. Lumin., 1165 (2000).

Kido, Junji; "Recent progress in organic light-emitting devices," Proceedings of the 1st International Display Manufacturing Conference IDMC 2000, Seoul Korea, Sep. 5, 2000, pp. 399-400.

Koch, N. et al., "Optimized hole Injection with Strong Acceptors at Organized-Metal Interfaces," Phys. Rev. Lett., vol. 95, pp. 237601-237603, Nov. 30, 2005.

Krieger et al. "Molecular analogue memory cell based on electrical switching and memory in molecular thin films," Synthetic Metals, 122, 199-202 (May 2001).

Kwong, R.C. et al. "Current Status of Electrophosphorescent Device Stability," Org. Electr., vol. 4 (2003): pp. 155-164.

Kwong, Raymond C., et al., "High operational stability of electrophosphorescent devices," Applied Physics Letters, Jul. 1, 2002, vol. 81, No. 1, pp. 162-164.

Lambert, M.A., "Volume-controlled current injection in insulators," Rep. Progr. Phys. 27, 329 (1964).

Lee et al. "The Effect of C60 doping on the device performance of organic light-emitting diodes," Applied Physics Letters, 86 (2005) 063514 (3 pages).

Lee, et al. "Effects of hydroxyl groups in polymeric dielectrics on organic transistor performance," Applied Physics Letters, 88, 162109 (2006).

Liping, Ma et al. "Nonvolatile electrical bistability of organic/metal-nanocluster/organic system," Appl. Phys. Lett. 82, 1419-1421 (Mar. 3, 2003).

Lu, Ping et al., "Synthesis of octasubstituted cyclooctatetrainees and their use as electron transporters in organic light emitting diodes," Journal of the American Chemical Society, 2000, vol. 1222, pp. 7480-7486.

Lupton, J. M. et al., "Bragg scattering from periodically microstructured light emitting diodes," Appl. Phys. Lett., vol. 77, pp. 3340-3342, Nov. 2000.

Ma, E.Y., et al. "Thin Film Transistors for Foldable Displays," IEEE Technical Digest, Electron Devices Meeting, 1997. IEDM '97. (Dec. 7-10, 1997): pp. 535-538.

Madigan, C.F. "Improvement of Output coupling efficiency of organic light emitting diodes by backside substrate modification," Appl. Phys. Lett., vol. 76, pp. 1650-1652, Mar. 2000.

Maennig, B. et al. "Controlled p-type doping of polycrystalline and amorphous organic layers: Self-consistent description of conductivity and field-effect mobility by a microscopic percolation model," Physical Review B, 64, 195208 (2001).

Matsumura, M. et al., "Analysis of current-voltage characteristics of organic light emitting diodes having a LiF/Al cathode and an Al-hydroxyquinoline/diamine junction," Applied Physics Letters, 2872 (1998).

Mattoussi, H. et al., "Photoluminescence quantum yield of pure and molecularly doped organic solid films," Journal of Applied Physics, (1999), vol. 86:5, p. 2642.

Miller, L.L. et al., "A simple comprehensive correlation of organic oxidation and ionization potentials," J. Org. Chem., 1972, vol. 37, No. 6, pp. 916-918.

Mori, T. et al., "Electroluminescence of organic light emitting diodes with alternately deposited dye-doped aluminum quinoline and diamine derivative," Journal of Physics D—Applied Physics, (1999), vol. 32:11, pp. 1198-1203.

Murata, Hideyuki et al., "Efficient organic light-emitting diodes with undoped active layers based on silole derivatives," Applied Physics Letters, Jan. 14, 2002, vol. 80, No. 2, pp. 189-191.

Naito, Katsuyuki et al.; "Molecular design, synthesis, and physical properties of nonpolymeric amorphous dyes for electron transport," The Journal of Physical Chemistry A, 1997, vol. 101, pp. 2350-2357.

Ohmori, Yutaka et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.

Ohmori, Yutaka et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.

Pacios, R., et al., "Charge separation in polyfluorene composites with internal donor/acceptor heterojunctions," Synthetic Metals, 2002, vol. 127, pp. 261-265.

Parker, "On the Problem of Assigning Values to Energy Changes of Electrode Reactions," Journal of the American Chemical Society, 96:17, Aug. 21, 1974, pp. 5656-5661.

Pfeiffer et al., "Controlled p-doping of pigment layers by cosublimation: Basic mechanisms and implications for their use in organic photovoltaic cells," Solar Energy Materials and Solar Cells, vol. 63, pp. 83-99, Jun. 1, 2000.

Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.

Pfeiffer, Martin et al., "Electrophosphorescent p-i-n organic light-emitting devices for very-high-efficiency flat-panel displays," Advanced Materials, (2002), vol. 14:22, Nov. 18, 2002, pp. 1633-1636.

Pope, et al., "Single positive or negative carriers in organic crystals," Electronic Processes in Organic Crystals and Polymers, Oxford Science Publications, Oxford University Press, (1999), pp. 202-207.

Potember, R.S. et al. "Electrical switching and memory phenomena in Cu-TCNQ thin films," Appl. Phys. Lett. 34, 405 (1979).

Pudzich, R., et al., "Synthesis and characterization of new oxadizoleamine based spiro-linked fluorescence dyes," Synthetic Metals, 2003, vol. 138, pp. 21-31.

R. Schlaf et al., "Homo/Lumo Alignment at PTCDA/ZnPc and PTCDA/ClInPc Heterointerfaces Determined by Combined UPS and XPS Measurements," J. Phys. Chem. B 1999, 103, pp. 2984-2992.

Redecker, M., et al., "Electron transport in starburst phenylquinoxalines," Applied Physics Letters, Jul. 5, 1999, vol. 75, No. 1, pp. 109-111.

Sakamoto, Gosuke et al., "Significant improvement of device durability in organic light-emitting diodes by doping both hole transport and emitter layers with rubrene molecules," Applied Physics Letters, (1999), vol. 75:6, pp. 766-768.

Sato, N., et al., "Polarization Energies of Organic Solids Determined by Ultraviolet Photoelectron Spectroscopy," J. Chem. Soc. Faraday Trans. 2, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.

Shinar, J. "Organic Light-Emitting Devices—A Survey" (Adachi et al. "Design concept of molecular materials for high-performance OLED" p. 43)) AIP-Press, Springer, New York 2004.

Shirota, Yasuhiko et al., "A novel class of emitting amorphous molecular materials as bipolar radical formants: 2-{4-[bis(4-methylphenyl)amino]phenyl}-5-(dimesitylboryl)thiophene) and 2-{4-[bis(9,9-dimethylfluorenyl)amino]phenyl}-5-(dimethylboryl)thiophene," Journal of the American Chemical Society, 2000, vol. 122, pp. 11021-11022.

Shirota, Yasuhiko; "Organic materials for electronic and optoelectronic devices," Journal of Materials Chemistry, 2000, vol. 10, pp. 1-25.

Signerski, et al. "The photovoltaic effect in a heterojunction of molybdenyl phthalocyanine and perylene dye," Journal of Non-Crystalline Solids, North-Holland Physics Publishing; vol. 352, No. 40-41, Nov. 1, 2006, pp. 4319-4324.

Tang, C. W., et al., "Electroluminescence of doped organic thin films," Journal of Applied Physics, (1989), vol. 65:9, pp. 3610-3616.

Tang, C.W. et al., "Organic electroluminescent diodes," Applied Physics Letters, vol. 51, No. 12, Sep. 21, 1987, pp. 913-915.

Tang, T.B. et al., "Ionization thresholds of merocyanine dyes in the solid state," Journal of Applied Physics, vol. 59, (1), Jan. 1986, pp. 5-10.

Tobat, P.; Saragi, I. et al., "Organic phototransfer based on intramolecular charge transfer in a bifunctional spiro compound," Applied Physics Letters, Mar. 29, 2004, vol. 84, No. 13, pp. 2334-2336.

Tokito, Shuzuo et al., "Improvement of emission efficiency in polymer light-emitting devices based on phosphorescent polymers," Thin Solid Films, Dec. 15, 2003, vol. 445, No. 2, pp. 353-357.

Tsiper, E.V. and Soos, Z.G.; "Charge redistribution and polarization energy of organic molecular crystals," Physical Review B; vol. 64; 195124-1.

Tsutsui, T. et al., "High quantum efficiency in organic light emitting devices with iridium-complex as a triplet emissive center," Jps. Journal of Applied Physics, part 2 letters, (1999), vol. 38:12B, pp. L1502-L1504.

Tsuzuki, T. et al. "The effect of fullerene doping on photoelectric conversion using titanyl phthalocyanine and a perylene pigment," Solar Energy Materials and Solar Cells, Elsevier Science Publishers, Amsterdam, vol. 61, No. 1, Feb. 15, 2000; pp. 1-8.

Vissenberg, M.C. et al. "Theory of the field-effect mobility in amorphous organic transistors," Physical Review B, 27, 12964 (1998).

Volkel, A. R. et al. "Carrier transport and density of state distributions in pentacene transistors," Physical Review B, 66, 195336 (2002).

Wang, S.D. et al. "Bottom contact ambipolar organic thin film transistor and organic inverter based on $C_{60}$/pentacene heterostructure," Organic Electronics, 7 (2006) pp. 457-464.

Werner, A. G. et al., "Pyronin B as a donor for n-type doping of organic thin films," Applied Physics Letters, vol. 82, No. 25, Jun. 23, 2003, pp. 4495-4497.

Werner, A.G. et al., "n-Type Doping of Organic Thin Films Using Cationic Dyes," Adv. Funct. Mater., vol. 14, No. 3 (Mar. 2004): pp. 255-260.

Wu, C.C. et al. "Integration of Organic LEDs and Amorphous Si TFTs Onto Flexible and Lightweight Metal Foil Substrates," IEEE Electron Device Letters, vol. 18, No. 12 (Dec. 1997): pp. 609-612.

Yamamoria, A et al., "Doped Organic Light Emitting Diodes having a 650-nm Thick Hole Transport Layer," Appl. Phys. Lett. vol. 72, No. 17 (Apr. 27, 1998); pp. 2147-2149.

Yamasaki, T. et al., "Organic Light emitting device with an ordered monolayer of silica microspheres as a scattering medium," Appl. Phys. Lett., vol. 76, pp. 1243-1245, Mar. 2000.

Yang, et al., 2003, "Self-assembly and Magnetic Properties of Cobalt Nanoparticles," Appl. Phys. Lett., 82(26): 4729.

Yang, Y. et al. "Organic electrical bistable devices and rewritable memory cells," Appl. Phys. Lett. 80, 2997 (2002).

Yao, Fu et al., "Quantum-chemical predictions of Absolute standard redox potentials of diverse organic molecules and free radicals in acetonitrile," J. Am. Chem. Soc. 2005, 127, pp. 7227-7234.

Yuan et al. "Fullerene-doped hole transport molecular films for organic light-emitting diodes," Applied Physics Letters, 86 (2005) 143509 (3 pages).

Zhi-Ming, Zhang; "Organic light emitting diodes based on new oxadiazole and pyrazoline derivatives," China Physics Letters, 2000, vol. 17, No. 6, pp. 454-456.

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

Zhou, X. et al., "Low-voltage inverted transparent vacuum deposited organic light-emitting diodes using electrical doping," Applied Physics Letters, vol. 81, No. 2, Jul. 29, 2002, pp. 922-924.

Zhou, X., et al. "High-efficiency electrophosphorescent organic light-emitting diodes with double light-emitting layers," Applied Physics Letters, Nov. 18, 2002, vol. 81, No. 21, pp. 4070-4072.

Final Office Action, U.S. Appl. No. 11/426,798; Dec. 30, 2009.
Non-Final Office Action, U.S. Appl. No. 11/426,798; Jun. 24, 2009.
Restriction Requirement, U.S. Appl. No. 11/426,798; Mar. 10, 2009.
Response to Office Action, U.S. Appl. No. 11/426,798; Oct. 22, 2009.
International Search Report for PCT/EP2007/003311; Nov. 1, 2007.
European Search Report and Opinion for EP05028081.7; May 18, 2006.
International Search Report for PCT/EP2006/012403; Mar. 28, 2007.
International Search Report for PCT/DE2005/001076; Dec. 20, 2005.
Canadian Search Report for Application No. 2543276; Aug. 24, 2009.
Non-final Office Action for U.S. Appl. No. 11/279,514; Jan. 14, 2010.
Response to Office Action for U.S. Appl. No. 11/279,514; Aug. 12, 2009.
Final Office Action for U.S. Appl. No. 11/279,514; May 13, 2009.
Response to Office Action for U.S. Appl. No. 11/279,514; Feb. 27, 2009.
Non-final Office Action for U.S. Appl. No. 11/279,514; Oct. 30, 2008.
Restriction Requirement for U.S. Appl. No. 11/279,514; Jul. 2, 2008.
Supplemental Notice of Allowability for U.S. Appl. No. 10/515,935; Jul. 27, 2007.
Notice of Allowance for U.S. Appl. No. 10/515,935; Jun. 5, 2007.
Office Action for U.S. Appl. No. 10/515,935; Aug. 14, 2006.
International Search Report for PCT/EP2007/011353; Apr. 28, 2008.
International Search Report for PCT/DE2006/000328; May 19, 2006.
Non-Final Office Action for U.S. Appl. No. 12/158,582; Feb. 4, 2010.
International Search Report for PCT/EP2006/012517; Mar. 20, 2007.
International Search Report for PCT/EP2007/000211; Mar. 12, 2007.
European Search Report/Opinion for EP 06026743.2; Nov. 7, 2007.
International Search Report for PCT/DE2005/001493; Jan. 19, 2006.
International Search Report for PCT/DE2008/000638; Sep. 11, 2008.
Non-Final Office Action for U.S. Appl. No. 11/421,249; Oct. 19, 2009.
Response to Office Action for U.S. Appl. No. 11/421,249; Aug. 20, 2009.
Final Office Action for U.S. Appl. No. 11/421,249; May 20, 2009.
Response to Office Action for U.S. Appl. No. 11/421,249; Mar. 18, 2009.
International Search Report for PCT/EP2006/012516; Mar. 27, 2007.
Non-Final Office Action for U.S. Appl. No. 11/574,058; Dec. 9, 2009.
Disclosure Under 37 C.F.R. 1.56 for U.S. Appl. No. 11/908,632 Submitted Herewith.

D'Andrade et al., Advanced Materials, "Efficient Organic Electrophosphorescent White-Light-Emitting Device with a Triple Doped Emissive Layer"; 2004 Wiley-VCH Verlag GmbH & Co., Weinheim; Adv. Mater. 2004, 16, No. 7, Apr. 5; pp. 624-628.

Baldo et al., Applied Physics Letters, vol. 75, No. 1, Jul. 5, 1999, "Very high-efficiency green organic light-emitting devices based on electrophosphorescence"; pp. 4-6.

Baldo et al., "Highly efficient phosphorescent emission from organic electroluminescent devices"; Nature, vol. 395, Sep. 10, 1998, pp. 151-154.

English translation of Japanese Office Action issued in counterpart Japanese App. No. 2008-501148; drafting date Mar. 1, 2011; mailing date Mar. 8, 2011.

* cited by examiner

LIGHT-EMITTING COMPONENT

The invention relates to a light-emitting component, in particular an organic light-emitting diode (OLED), having an electrode and a counterelectrode and an organic region—arranged between the electrode and the counterelectrode—with a light-emitting organic region, which comprises an emission layer and a further emission layer and which, upon application of an electrical voltage to the electrode and the counterelectrode, is formed in a manner emitting light in a plurality of colour ranges in the visible spectral range, optionally through to white light.

PRIOR ART

Increased attention has been given in recent years to organic light-emitting diodes which emit light in a plurality of colour ranges through to white light. It is generally recognized that this technology has a great potential for possible applications in the field of illumination technology. White organic light-emitting diodes are now reaching power efficiencies that lie in the region of conventional electrical incandescent lamps (cf. Forrest et al., Adv. Mater. 7, 624 (2004)). Further improvements are expected. Consequently, white OLEDs have the potential to form a significant alternative to the illumination technologies that currently dominate the market, for example incandescent lamps, halogen lamps, low-voltage fluorescent tubes or the like.

In general, for OLEDs based on low molecular weight substances ("small molecules"), higher efficiencies can be obtained if phosphorescent emitters are used. The latter can utilize up to 100% of the excitons arising, which corresponds to an internal quantum efficiency of 100%, in contrast to fluorescent emitters, which utilize only the 25% proportion of singlet excitons (cf. Baldo et al., Nature 395, 151 (1998); Baldo et al., Appl. Phys. Lett. 75, 4 (1999)). The term phosphorescent emitter denotes a material that is able to emit phosphorescent light. In the same way, the term fluorescent emitter denotes a material that is able to emit fluorescent light.

According to the current state of the art, white OLEDs having the highest known efficiencies are based on phosphorescent emitters (cf. D'Andrade et al., Adv. Mater. 16, 624 (2004)).

However, a breakthrough of white OLEDs on the illumination market still requires significant technical improvements. One challenge that has not yet been satisfactorily solved at the present time is to realize high-efficiency white OLEDs having a long lifetime. White light sources corresponding to the state of the art have lifetimes of approximately 750 h in the case of an incandescent bulb and up to 10,000 h in the case of a fluorescent tube. In white OLEDs, a contribution of blue or at least blue-green emitters is generally required. The long-term stability of blue phosphorescent emitters is extremely limited, however. Long lifetimes of blue OLED emitters in the range of a few thousand to tens of thousands of hours are only known for fluorescent emitters, which, however, can only utilize a maximum of 25% of the excitons arising for the generation of light. Green and red phosphorescent emitters in turn are known with lifetimes in the range of several tens of thousands to hundreds of thousands of hours.

In actual fact there has not hitherto been any satisfactory solution to this problem. Lifetimes of while OLEDs which are based on blue triplet emitters are too low for them to be suitable for products capable of application. Therefore, all approaches for introducing white OLEDs into production are currently directed towards the use of fluorescent blue emitters. Although the efficiencies are low in these approaches, the lifetime corresponds to industry specifications in the region of a few 10,000 h at a few 100 $cd/m^2$. Both phosphorescent and fluorescent emitters are appropriate as red or green or orange emitters since the lifetimes of the triplet emitters are already high enough for these colours. There are numerous approaches for generating white light, for example by means of mixing two colours, for example the colours blue-green and orange, or mixing three colours, for example the colours red, green and blue. The mixing in turn may be effected in different ways, for example by means of:
- stacking the varicoloured emitting OLEDs one above another,
- positioning varicoloured emitting OLEDs one alongside another,
- introducing varicoloured emitters into the same emission layer, or
- introducing the varicoloured emitters into different emission layers, which may be separated from one another with the aid of thin intermediate layers.

The document US 2003/0042848 A1 discloses an organic electroluminescent display device having a substrate with a plurality of sub-pixel regions for red, green and blue. The sub-pixel regions each comprise a layer made of a light-emitting material between two electrodes. The light-emitting material of at least one of the plurality of sub-pixel regions comprises a phosphorescent material.

THE INVENTION

The invention is based on the object of providing an improved light-emitting component of the type mentioned in the introduction which, in conjunction with high efficiency, also has a lifetime that is long enough for illumination purposes.

This object is achieved according to the invention by means of a light-emitting component according to independent Claim 1. Dependent subclaims relate to advantageous refinements of the invention.

The invention provides a light-emitting component, in particular organic light-emitting diode, having an electrode and a counterelectrode and an organic region—arranged between the electrode and the counterelectrode—with a light-emitting organic region, which comprises an emission layer and a further emission layer and which, upon application of an electrical voltage to the electrode and the counterelectrode, is formed in a manner emitting light in a plurality of colour ranges in the visible spectral range, optionally through to white light, in which case: the emission layer comprises a fluorescent emitter which emits light predominantly in the blue or in the blue-green spectral range; the further emission layer comprises one or a plurality of phosphorescent emitters emitting light predominantly in the non-blue spectral range; a triplet energy for an energy level of a triplet state of the fluorescent emitter in the emission layer is greater than a triplet energy for an energy level of a triplet state of the phosphorescent emitter in the further emission layer; and an at least 5% proportion of the light generated in the light-emitting organic region is formed in the visible spectral range as fluorescent light from singlet states of the fluorescent emitter in the emission layer.

The invention has the advantage over the prior art of providing a high-efficiency and at the same time long-lived light-emitting component for light in a plurality of colour ranges in the visible spectral range through to white light. The problem that blue fluorescent emitters admittedly have a long lifetime but are not very efficient is overcome by virtue of the fact that triplet excitons which arise upon application of the electrical energy in the emitter which emits light predominantly in the blue or in the blue-green spectral range and which normally decompose non-radiatively are utilized for light emission in particular on account of the configuration of the triplet energy for the energy level of the triplet state of the fluorescent emitter in the emission layer and of the triplet energy for the energy level of the triplet state of the phosphorescent emitter in the further emission layer. In this way, it is possible to transfer the energy from the triplet state of the fluorescent emitter in the emission layer to the triplet state of the phosphorescent emitter in the further emission layer. At the same time, light is emitted in the blue or blue-green spectral range upon the decomposition of the singlet states of the fluorescent emitter in the emission layer. In the organic light-emitting region of the component, the following processes, in particular, proceed:

a) the predominant majority of the excitons formed in the organic light-emitting region when the electrical energy is supplied in the component is formed on the fluorescent emitter in the emission layer in the form of singlet excitons and triplet excitons;
b) a portion of the singlet excitons decomposes radiatively with emission of blue or blue-green fluorescent light;
c) the triplet excitons diffuse by means of excitation energy transfer from the emission layer into the further emission layer containing the phosphorescent emitter; and
d) the triplet excitons of the phosphorescent emitter decompose radiatively with emission of non-blue phosphorescent light.

In this way, the energy fed to the organic region arranged between the electrode and the counter electrode is converted with high efficiency for the generation of light having different wavelengths in the visible spectral range.

Therefore, one essential aspect is the combination of long-lived emitter materials with high-efficiency emitter materials. As already mentioned, a white-emitting OLED is always based on the fact that one or a plurality of emitter(s) emitting blue or blue-green is/are implemented. A fluorescent emitter material is used here as the emitter since the lifetimes of phosphorescent blue or blue-green emitters are orders of magnitude too low for practically all conceivable applications. With fluorescent blue emitters, by contrast, lifetimes of more than 20,000 h with a brightness of 1000 $cd/m^2$ are already achieved today. The situation is different for red and green emitters. Here long lifetimes are actually already obtained even with phosphorescent emitters, for example 30,000 h with a brightness of 500 $cd/m^2$ for red OLEDs. The invention makes it possible, despite the utilization of a fluorescent blue emitter, also to utilize the majority, for example approximately 80 to 90%, of the triplet excitons produced in the blue-emitting emission layer for the generation of light and thus to increase the current efficiency of the component by a factor of 1.5 to 2.

One expedient refinement of the invention provides for an at least 10% proportion of the light generated in the light-emitting organic region to be formed in the visible spectral range as fluorescent light of the singlet states of the fluorescent emitter in the emission layer.

In one refinement of the invention, it may be provided that an at least 15% proportion of the light generated in the light-emitting organic region is formed in the visible spectral range as fluorescent light of the singlet states of the fluorescent emitter in the emission layer.

One preferred development of the invention provides for an at least 20% proportion of the light generated in the light-emitting organic region to be formed in the visible spectral range as fluorescent light of the singlet states of the fluorescent emitter in the emission layer.

Preferably, one development of the invention may provide for an at least 25% proportion of the light generated in the light-emitting organic region to be formed in the visible spectral range as fluorescent light of the singlet states of the fluorescent emitter in the emission layer.

In one expedient development of the invention, it is provided that a hole blocking layer is arranged between the emission layer and the cathode, the hole blocking layer transporting electrons and an organic material of the hole blocking layer having an HOMO level which is at least approximately 0.3 eV lower than an HOMO level of the fluorescent emitter in the emission layer.

One expedient development of the invention may provide for an electron blocking layer to be arranged between the emission layer and the anode, the electron blocking layer transporting holes and an organic material of the electron blocking layer having an LUMO level which is at least approximately 0.3 eV higher than an LUMO level of the fluorescent emitter in the emission layer.

One embodiment of the invention preferably provides for the emission layer and/or the further emission layer and/or the other emission layer to be formed in multilayer fashion.

One advantageous development of the invention provides for the emission layer to have a thickness of between approximately 5 nm and approximately 50 nm.

One expedient development of the invention may provide for the light-emitting organic region to be formed in a manner emitting white light, the or all of the phosphorescent emitters in the further emission layer being emitters emitting light in the red, orange or yellow spectral range.

In one preferred embodiment of the invention, it is provided that the light-emitting organic region is formed in a manner emitting white light, the or all of the phosphorescent emitters in the further emission layer being emitters emitting light in the red, orange or green spectral range.

One advantageous refinement of the invention provides for the light-emitting organic region to be formed in a manner emitting white light, the or all of the phosphorescent emitters in the other emission layer being emitters emitting light in the red, orange or yellow spectral range.

In one development of the invention, it is expediently provided that the light-emitting organic region is formed in a manner emitting white light, the or all of the phosphorescent emitters in the other emission layer being emitters emitting light in the red, orange or green spectral range.

One expedient development of the invention provides for the fluorescent emitter in the emission layer to be an organometallic compound or a complex compound with a metal having an ordinal number of less than 40.

One preferred development of the invention may provide for the fluorescent emitter in the emission layer to comprise an electron-attracting substituent from one of the following classes:
a) halogens such as fluorine, chlorine, iodine or bromine;
b) CN;
c) halogenated or cyano-substituted alkanes or alkenes, in particular trifluoromethyl, pentafluoroethyl, cyanovinyl, dicyanovinyl, tricyanovinyl;
d) halogenated or cyano-substituted aryl radicals, in particular pentafluorophenyl; or
e) boryl radicals, in particular dialkylboryl, dialkylboryl having substituents on the alkyl groups, diarylboryl or diarylboryl having substituents on the aryl groups.

One advantageous development of the invention provides for the fluorescent emitter in the emission layer to comprise an electron-donating substituent of one of the following classes:
a) alkyl radicals such as methyl, ethyl, tert-butyl, isopropyl;
b) alkoxy radicals;
c) aryl radicals with or without substituents on the aryl, in particular tolyl and mesityl; or
d) amino groups, in particular NH2, dialkylamine, diarylamine and diarylamine having substituents on the aryl.

One embodiment of the invention expediently provides for the fluorescent emitter in the emission layer (EML1) to comprise a functional group having an electron acceptor property from one of the following classes:
a) oxadiazole
b) triazole
c) benzothiadiazoles
d) benzimidazoles and N-aryl-benzimidazoles
e) bipyridine
f) cyanovinyl
g) quinolines
h) quinoxalines
i) triarylboryl
j) silol units, in particular derivative groups of silacyclopentadiene
k) cyclooctatetraene
l) quinoid structures and ketones, including quinoid thiophene derivatives
m) pyrazolines
n) pentaaryl cyclopentadiene
o) benzothiadiazoles
p) oligo-para-phenyl with electron-attracting substituents, or
q) fluorenes and spiro-bifluorenes with electron-attracting substituents.

In one expedient development of the invention, it is provided that the fluorescent emitter in the emission layer (EML1) comprises a functional group having an electron acceptor property from one of the following classes:
a) triarylamines
b) oligo-para-phenyl or oligo-meta-phenyl
c) carbazoles
d) fluorene or spiro-bifluorenes
e) phenylene-vinylene units
f) naphthalene
g) anthracene
h) perylene
i) pyrene or
j) thiophene.

EXEMPLARY EMBODIMENTS OF THE INVENTION

The invention is explained in more detail below on the basis of exemplary embodiments with reference to figures of the drawing, in which.

Figure 1:
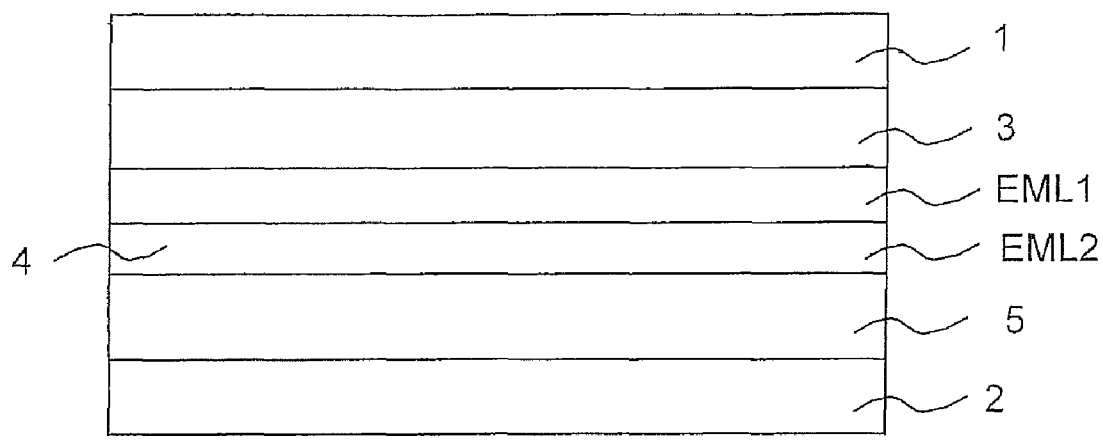
FIG. 1 shows a schematic illustration of a layer arrangement of an organic light-emitting diode.

FIG. 1 shows a schematic illustration of a layer arrangement of an organic light-emitting diode (OLED). Two electrodes, namely an anode 1 and a cathode 2, are formed, between which is arranged an organic region with a hole transport layer 3 made of an organic substance doped with an acceptor material, an organic light-emitting region 4 with an emission layer EML1 and a further emission layer EML2 and also an electron transport layer 5 made of an organic substance doped with a donor material. The emission layer EML1 comprises a fluorescent emitter which emits light predominantly in the blue or in the blue-green spectral range. In an alternative embodiment, the emission layer EML1 comprises a plurality of fluorescent emitters emitting light predominantly in the blue or in the blue-green spectral range. The further emission layer EML2 comprises one or a plurality of phosphorescent emitter(s) emitting light predominantly in the non-blue spectral range.

Figure 2:
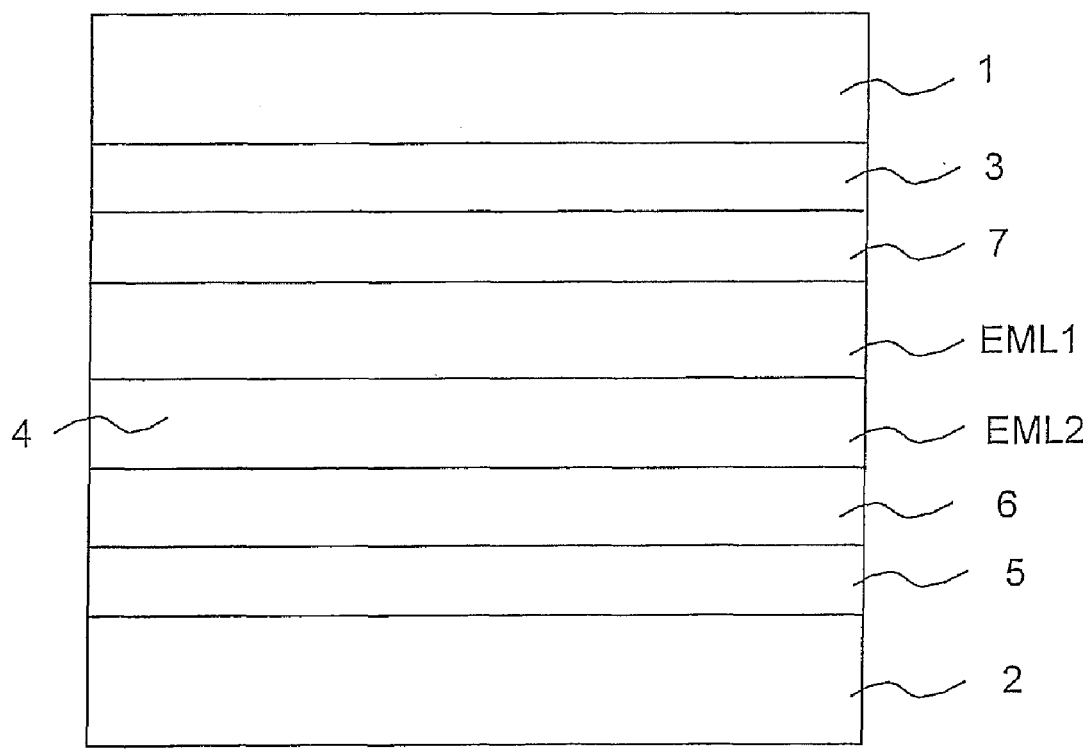
FIG. 2 shows a schematic illustration of a layer arrangement of a further organic light-emitting diode.

FIG. 2 shows a schematic illustration of a layer arrangement of a further OLED. For identical features, the same reference symbols as in FIG. 1 are used in FIG. 2. In the case of the OLED in FIG. 2, a hole blocking layer 6 and an electron blocking layer 7 are additionally provided in the organic region.

Within the OLED, the following processes proceed during operation:
charge carriers in the form of holes are injected through the anode 1 into the hole transport layer 3, migrate through the hole transport layer 3 and reach, if appropriate through the electron blocking layer 7, the light-emitting organic region 4;
charge carriers in the form of electrons are injected through the cathode 2 into the electron transport layer 5, migrate through the electron transport layer 5 and reach, if appropriate through the hole blocking layer 6, the light-emitting organic region 4; and
in the organic light-emitting region 4, holes and electrons meet one another and recombine to form excited states, so-called excitons, which are formed in triplet and singlet states.

With regard to their transport or conduction properties, the organic materials used may conduct electrons/transport electrons, in which case said materials may then also conduct holes/transport holes. It holds true in the same way that an organic material designated as one which conducts holes/transports holes may also conduct electrons/transport electrons, so that the two properties are not mutually exclusive.

It is advantageous in the implementation of the arrangement if the energetic distance between the singlet state and the triplet state of the emitter which emits in the blue or blue-green spectral range in the emission layer EML1 is as small as possible, thereby enabling an exothermic energy transfer to the triplet states of the emitters which emit in the non-blue spectral range in the further emission layer EML2. The following design principles are preferably utilized for the emitter emitting in the blue or blue-green spectral range:

i) the emitter material is an organometallic compound or a complex compound, the lowest excitation state exhibiting "metal-to-ligand-charge-transfer" character (MLCT), which means that, in the event of excitation, an electron is lifted from an orbital which is predominantly localized on the metal to an orbital which is predominantly localized on the organic ligand.

ii) the emitter material is push-pull-substituted, which means that at least one substituent having electron-donating character and at least another substituent having electron-attracting character are attached to a basic skeleton via which the pi-electrons of the HOMO and LUMO wave functions (HOMO—"Highest Occupied Molecular Orbital"; LUMO—"Lowest Unoccupied Molecular Orbital") are delocalized, so that the centroid of the HOMO wave function is shifted towards the electron-donating substituents and the centroid of the LUMO wave function is shifted towards the electron-attracting substituents and the spatial overlap of HOMO and LUMO wave functions thus decreases in comparison with a corresponding molecule without substituents or one with exclusively electron-attracting or exclusively electron-donating substituents.

iii) The pi-electron system of the emitter material extends over functional groups which in part rather exhibit electron acceptor character and on which the LUMO wave function is correspondingly concentrated, and other functional groups which rather exhibit electron donor character and on which the HOMO wave function is consequently concentrated.

Figure 12:
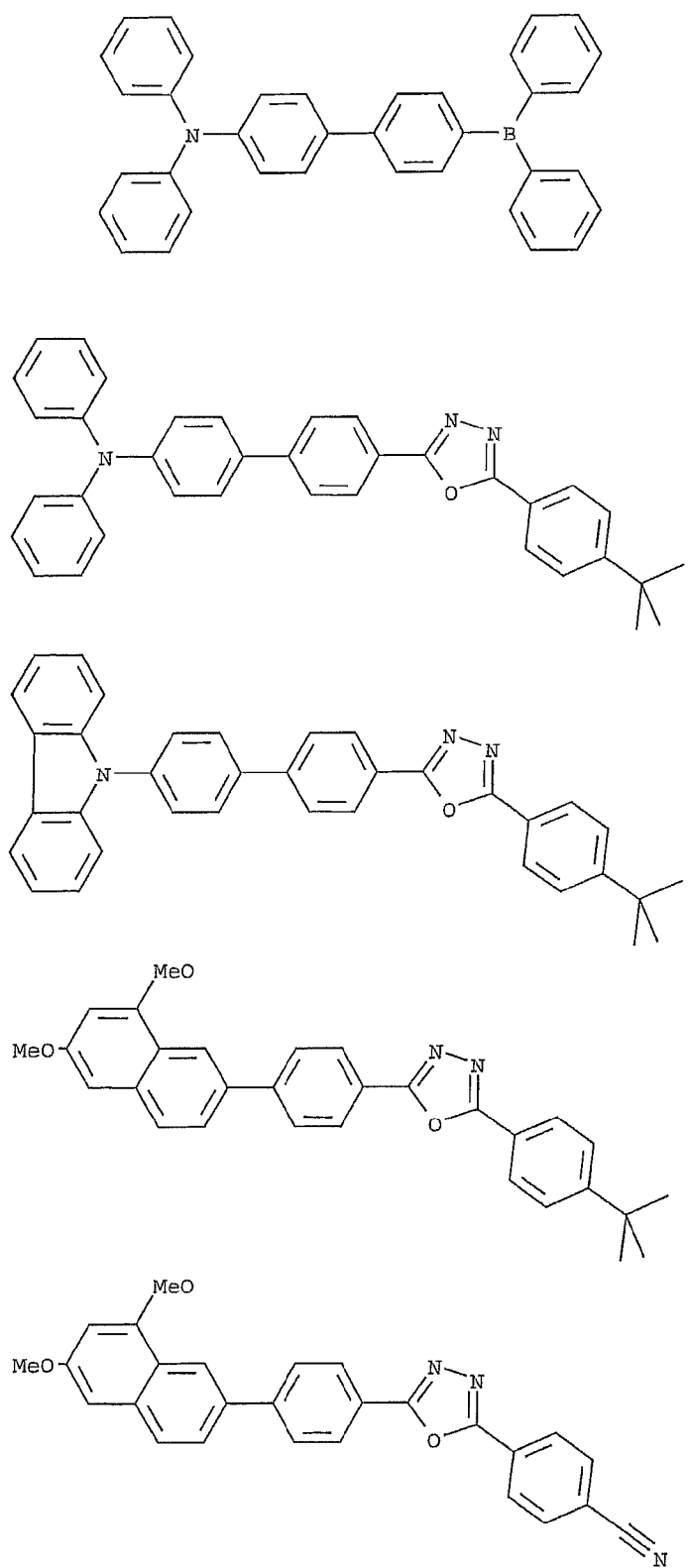
FIG. 12 shows structural formulae for molecules of an emitter material.

FIG. 12 shows structural formulae for molecules of emitters emitting in the blue or blue-green spectral range, in which the abovementioned design rules are taken into account.

The OLEDs according to FIGS. 1 and 2 are distinguished by the fact that the charge carrier recombination is predominantly effected in the emission layer EML1, as a result of which both triplet and singlet excitons form in the emission layer EML1. The position of a main recombination zone is influenced in a targeted manner. The term main recombination zone denotes a spatial zone within the region of the organic layers between the anode 1 and the cathode 2 in which at least approximately 50% of the injected charge carriers recombine.

Embodiments for influencing the main recombination zone in a targeted manner are described below with reference to FIGS. 3 to 5. The same reference symbols as in FIGS. 1 and 2 are used for identical features in FIGS. 3 to 5.

Figure 3:
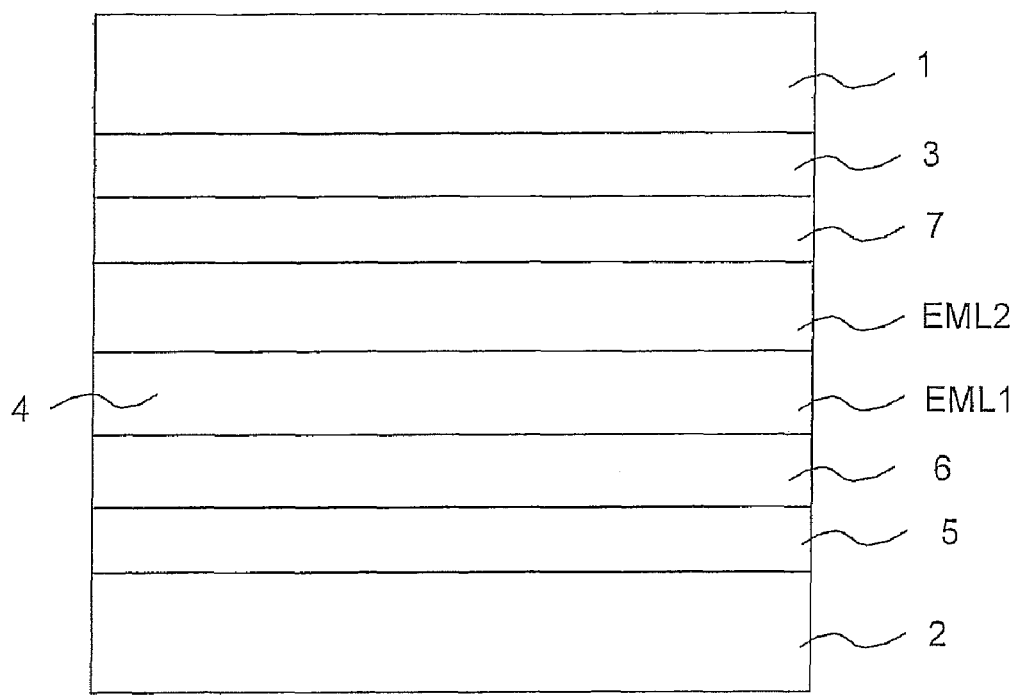
FIG. 3 shows a schematic illustration of a layer arrangement of an organic light-emitting diode in which a main recombination zone is formed in a targeted manner according to a first embodiment.

In an OLED according to FIG. 3, the position of the main recombination zone is influenced by virtue of the fact that the further emission layer EML2 preferably transports holes as charge carriers, that is to say that the further emission layer EML2 is formed such that it conducts/transports holes, and is arranged directly adjacent to the electron blocking layer 7 or, if such a layer is not present in another embodiment (not illustrated), directly adjacent to the hole transport layer 3.

In this case, the emission layer EML1 with the fluorescent emitter is in direct proximity to the hole blocking layer 6 or, if this layer is not present, in direct proximity to the electron transport layer 5. In this embodiment, it is furthermore provided that the emission layer EML1 also preferably transports holes, that is to say that the emission layer EML1 is formed such that it conducts/transports holes. It is ensured in this way that the holes meet the electrons, and recombine with them to form excitons, preferably in the vicinity of the interface between the emission layer EML1 and the hole blocking layer 6 or, if this layer is not provided, the electron transport layer 5.

Although the main recombination zone is situated in the vicinity of said interface, the recombination takes place almost exclusively in the emission layer EML1 and not in the adjoining layer. An arrangement such as this prevents, in particular, electrons from being transported deep into the emission layers EML1, EML2 which would result in a widening of the emission zone or, in the worst case, might lead to a recombination of the electrons and the holes in the further emission layer EML2, which would counteract the intended optimized generation of white light.

A particularly advantageous refinement of the embodiment with the hole blocking layer 6 provides for a minimum energy of singlet excitons and of triplet excitons in the hole blocking layer 6 to be greater than a minimum energy of singlet excitons and of triplet excitons in the emission layer EML1. What is thereby achieved is that the triplet excitons which arise in the emission layer EML1 can diffuse only in the direction of the further emission layer EML2, whereby the efficiency of the OLED increases. If no hole blocking layer is provided, this requirement made of the exciton energy, for an advantageous refinement of the invention, applies analogously to the electron transport layer.

Figure 4:
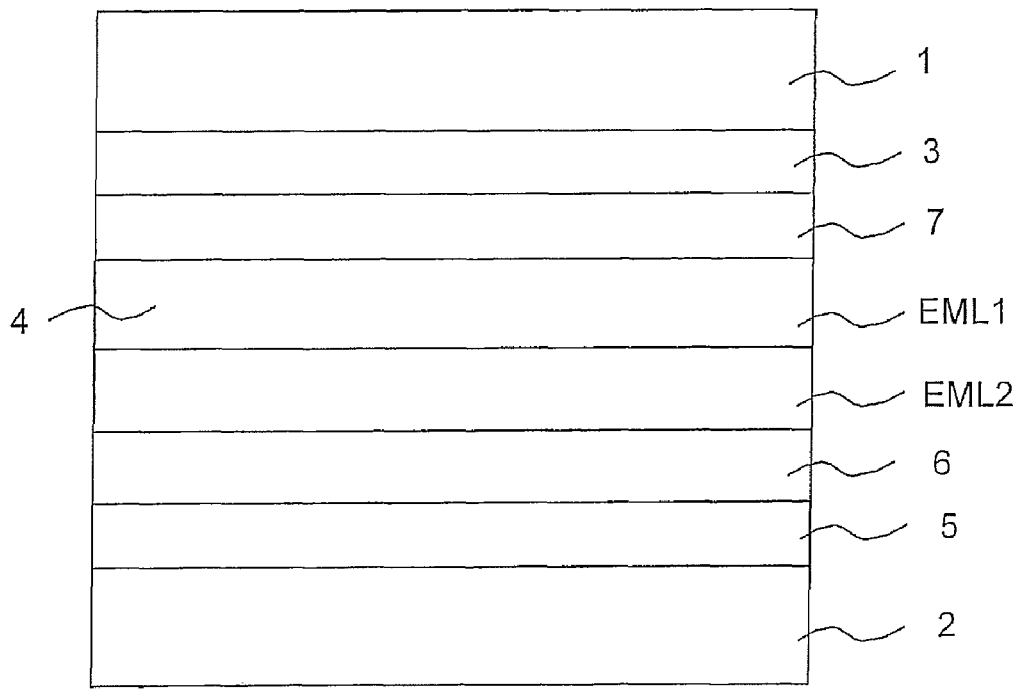
FIG. 4 shows a schematic illustration of a layer arrangement of an organic light-emitting diode in which the main recombination zone is formed in a targeted manner according to a second embodiment.

An alternative arrangement for controlling the position of the main recombination zone is realized in an embodiment of an OLED according to FIG. 4 by virtue of the fact that the further emission layer EML2 with the phosphorescent emitter preferably transports electrons as charge carriers, that is to say that the further emission layer EML2 is formed such that it conducts/transports electrons, and is arranged directly adjacent to the hole blocking layer 6 or, if such a layer is not present in another embodiment (not illustrated), directly adjacent to the electron transport layer 5.

In this case, the emission layer EML1 with the fluorescent emitter is in direct proximity to the electron blocking layer 7 or, if this layer is not present, in direct proximity to the hole transport layer 3. In this embodiment, it is furthermore provided that the emission layer EML1 preferably transports electrons as charge carriers, that is to say that the emission layer EML1 is formed such that it conducts/transports electrons. This ensures that the electrons meet the holes, and recombine with them to form excitons, preferably in the vicinity of the interface between the emission layer EML1 and the electron blocking layer 7 or, if this layer is not provided, the hole transport layer 3. Although the main recombination zone is situated in the vicinity of said interface, the recombination takes place almost exclusively in the emission layer EML1 and not in the adjoining layer. An arrangement such as this prevents, in particular, holes from being transported deep into the emission layers EML1, EML2 which would result in a widening of the emission zone or, in the worst case, might lead to a recombination of the electrons and the holes in the further emission layer EML2, which would counteract the intended optimized generation of white light.

A particularly advantageous refinement of the embodiment with the electron blocking layer 7 provides for a minimum energy of singlet excitons and of triplet excitons in the electron blocking layer 7 to be greater than a minimum energy of singlet excitons and of triplet excitons in the emission layer EML1. What is thereby achieved is that the triplet excitons which arise in the emission layer EML1 can diffuse only in the direction of the further emission layer EML2, whereby the efficiency of the OLED increases. If no electron blocking layer is provided, this requirement made of the exciton energy, for an advantageous refinement of the invention, applies analogously to the hole transport layer.

For the exemplary embodiments explained, the thickness of the emission layer EML1 with the fluorescent emitter(s) is to be chosen such that it is greater than a diffusion length of the singlet excitons, which is in the region of approximately 20 nm for example for $Alq_3$, but less than a diffusion length of the triplet excitons, which is in the region of approximately 140 nm for example for $Alq_3$ (cf. A. Hunze, Organische Leuchtdioden auf Basis von dotierten Emissionsschichten [Organic light-emitting diodes based on doped emission layers], Shaker Verlag, 2003). These diffusion lengths are different, of course, for other materials. It can generally be assumed that the diffusion length of the singlet excitons is between approximately 5 nm and approximately 30 nm. Therefore, one advantageous embodiment provides for a thickness of the emission layer EML1 of between approximately 7 nm and approximately 35 nm depending on the fluorescent emitter layer used.

On the other hand, this layer ought not to become too thick since resistive losses then become greater and, moreover, increasingly fewer triplet excitons reach the further emission layer EML2 with the phosphorescent emitter(s). Therefore, the emission layer EML1 with the fluorescent emitter(s) is preferably thinner than approximately 100 nm, more preferably thinner than approximately 60 nm.

Figure 5:
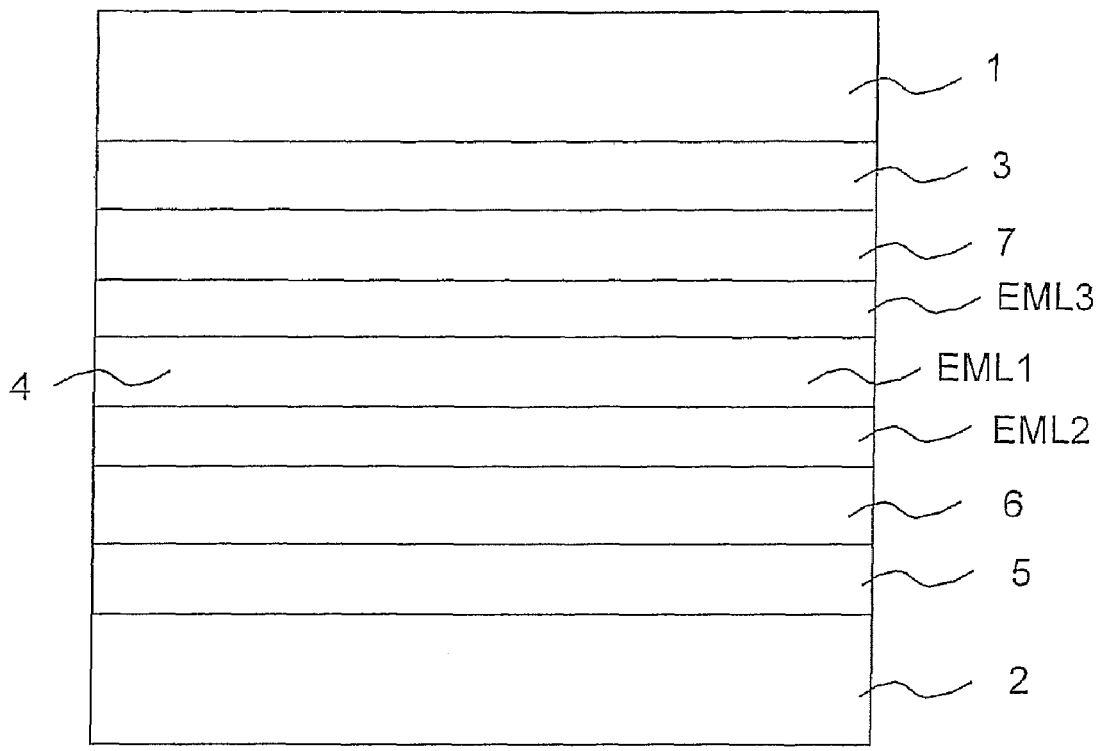
FIG. 5 shows a schematic illustration of a layer arrangement of an organic light-emitting diode in which the main recombination zone is formed in a targeted manner according to a third embodiment.

FIG. 5 shows an OLED in which a further possibility for influencing the position of the main recombination zone is formed by virtue of the fact that the emission layer EML1 is arranged between the further emission layer EML2 with the phosphorescent emitter(s) and another emission layer EML3 having one or a plurality of phosphorescent emitter(s), the emission layer EML2 preferably transporting electrons and the other emission layer EML3 preferably transporting holes. If appropriate, the two emission layers EML2, EML3 can emit light in different wavelength ranges. In this case, it is necessary for the emission layer EML1 to have an ambipolar transport behaviour, that is to say for the emission layer EML1 to have both electron transport and hole transport properties, so that the main recombination zone does not form at the interface between one of the two emission layers EML2, EML3 and the emission layer EML1 but rather in the emission layer EML1. In this embodiment, the thickness of the emission layer EML1 is to be chosen such that the thickness is greater than approximately twice the diffusion length of the singlet excitons but less than approximately twice the diffusion length of the triplet excitons. An advantageous embodiment provides for the thickness of the emission layer EML1 to be approximately 15 nm to approximately 100 nm.

Calculations for optimizing the efficiency with regard to the colour spectrum of the embodiments described are explained below.

Figure 6:
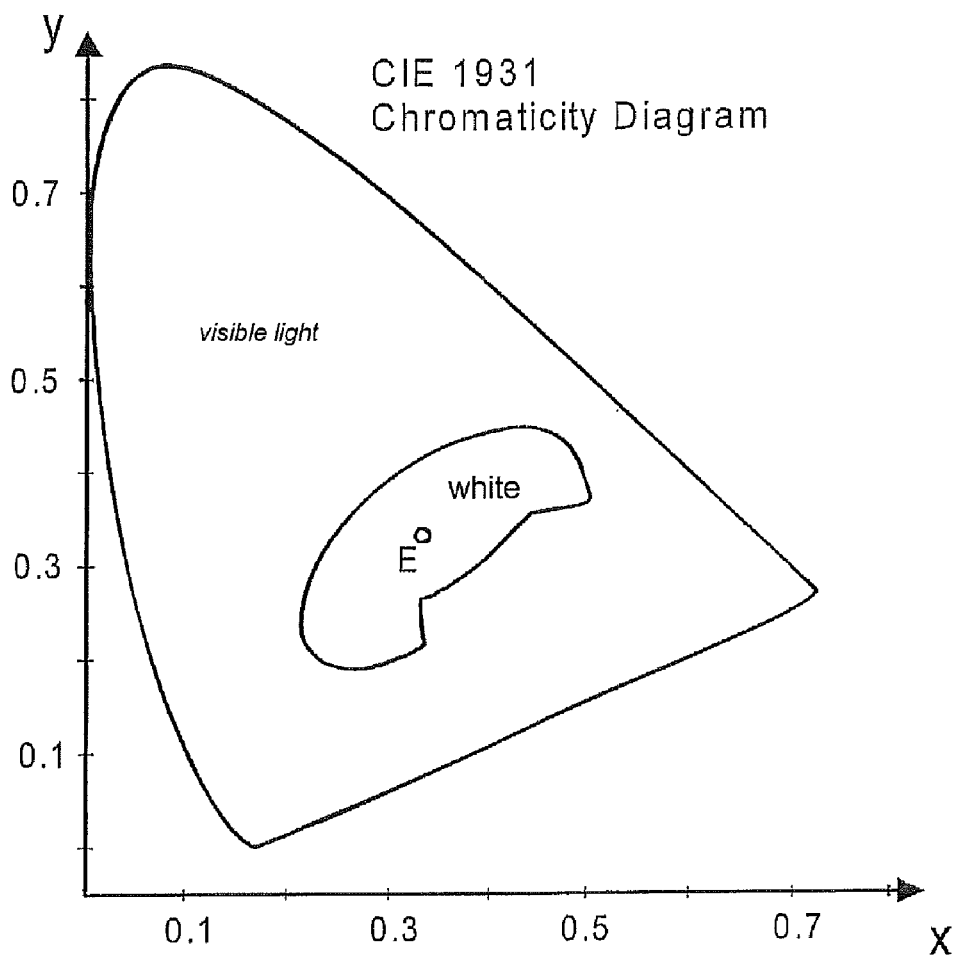
FIG. 6 shows a CIE chromaticity diagram.

In order to obtain a white light emission by a plurality of coloured emitters, it is necessary for the proportion of the different colour components to be well balanced, which means that the proportions of the individual components with respect to one another must be in a specific, suitable relationship. A description of the quality of white light can be given by means of the CIE colour coordinates x and y described in the CIE chromaticity diagram of 1931. In this case, an optimum white hue is given by the colour coordinates x=0.33 and y=0.33. A while OLED is understood here to be an OLED which emits light whose colour coordinate lies within the white region of the CIE chromaticity diagram as illustrated in FIG. 6. The "Colour Rendering Index" (CRI) gives an indication about how many components of the natural solar spectrum are contained in a white light source. CRI values of above 65 mean that the white is already a very "saturated" white.

In order to obtain high efficiencies for the optimum colour locus of 0.33/0.33, it is desirable to use the individual emitter materials such that the proportion of the blue/blue-green light is as far as possible 25% of the total light emitted by the OLED, since the theoretically obtainable internal quantum efficiency is maximal in this case. On the basis of these considerations, calculations were carried out with respect to the quantum efficiencies that can be obtained by means of the invention.

Figure 7:
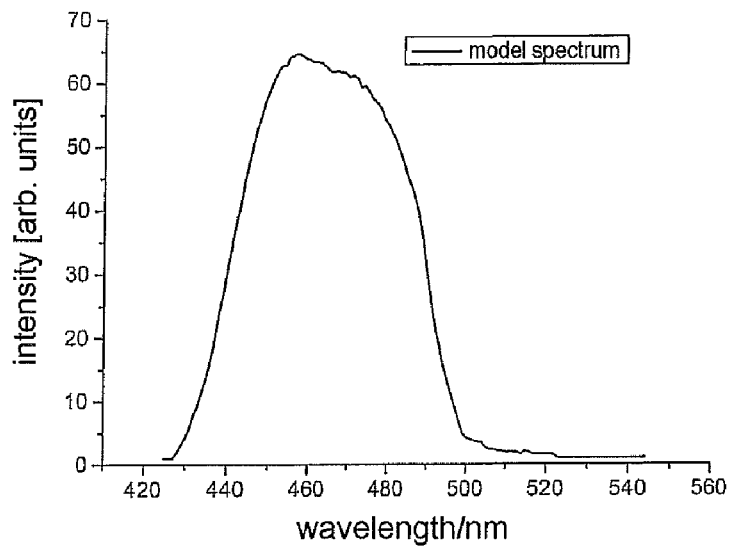
FIG. 7 shows a model spectrum for an emitter material emitting light in the blue spectral range.

The calculations use different emitter spectra for red, green and blue emission as a basis. Electroluminescence spectra of known phosphorescent emitters which correspond to the state of the art ("SOA") were used for green and red, whereas besides an electroluminescence spectrum of a fluorescent emitter corresponding to the state of the art, an artificially generated model spectrum—which is shown in FIG. 7—was also used for the fluorescent emitter emitting in the blue/blue-green spectral range.

These spectra and the photometric radiation equivalents that can be derived directly from them were used as a basis to calculate what proportion of light generation by the individual emitters is required to obtain a balanced white light emission at a reference point having the CIE colour coordinates 0.33/0.33. The calculations were carried out by means of a software for the simulation of RGB display elements. This software makes it possible to calculate the light proportion which is required by the individual pixels in order to obtain a colour mixing for a specific point within the CIE diagram of 1931. The calculations were carried out for white light generation by means of a blue, green and red emitter. These considerations can be applied to the use of an emitter system having two emitters.

The software used permits the calculation of the current which is required by the individual pixels of a colour if the colour coordinates of the pure emitter and also its current efficiency are known. The following assumptions were made for using the program for the calculations. The quantum efficiencies of all the emitters are regarded as identical if an identical emission mechanism is taken as a basis, for example for two phosphorescent triplet emitters. It was furthermore assumed that the quantum efficiency of a fluorescent singlet emitter is 25% of the quantum efficiency of a triplet emitter.

In order to feed the values for the current efficiency of the emitters into the software used, values proportional to the photometric radiation equivalents of the individual emitters were used. In the case of singlet emitters, values proportional to 25% of the photometric radiation equivalent were used in order to take account of the reduced quantum efficiency in comparison with triplet emitters.

In the case of the invention, however, the situation deviates from the assumptions outlined previously since, in this case, for the singlet emitter emitting in the blue spectral range, 100% of the corresponding photometric radiation equivalents was used for the calculation. This assumption can be made since, in the case set forth, all the excitons are formed in the emission layer EML1 on the fluorescent emitter(s) and the singlet excitons are emitted there as light. The triplet excitons, by contrast, diffuse into the emission layers EML2/EML3 with the triplet emitter(s) where they decompose radiantly. On account of this circumstance, a white emission system in an organic light-emitting diode which utilizes this mechanism can achieve a maximum theoretical quantum efficiency of 100% if 25% of the light emission which is required for generating the white light is emitted by the fluorescent blue emitter and 75% by the triplet emitters.

Figure 8:
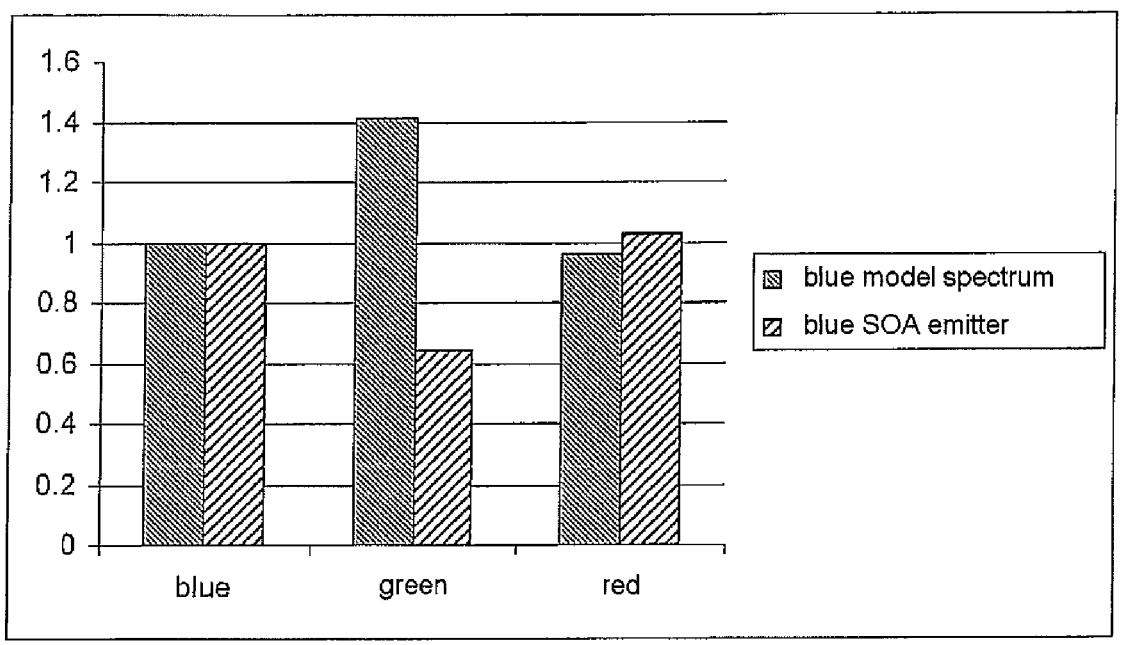
FIG. 8 shows a diagram for comparison of the necessary blue emission light when generating white light for different light emissions in the green and red spectral ranges.

A first aim of the calculations was to show how a well-balanced and high-efficiency white light emission can be realized on the basis of the invention if a realistic blue emission spectrum is taken as a basis. These calculations were carried out with a blue model spectrum and the electroluminescence spectrum of a blue fluorescent emitter corresponding to the state of the art (cf. FIG. 8).

In the case of white light generation on the basis of the blue model spectrum, this requires 28% of the emission by the fluorescent blue emitter, whereas 37% of the total light emission would have to be generated by the fluorescent blue emitter when using the known blue electroluminescence spectrum. It emerges from this that the theoretical efficiency for the model considered, compared with an efficiency of 100% in the case of a perfect white light emission exclusively on the basis of triplet emission, is 89% in the case of the model spectrum, whereas this value decreases to 68% in the case of the known blue electroluminescence spectrum.

These values can now be compared with other approaches for white light OLEDs, based on exclusively fluorescent singlet emitters or on a blue singlet emitter and a red and green triplet emitter; this comparison is reproduced in table 1.

TABLE 1

| | | B[%] | G[%] | R[%] | Total photometric radiation equivalent relative | Total efficiency |
|---|---|---|---|---|---|---|
| Exclusively singlet emitters | Blue model spectrum | 0.28 | 0.33 | 0.39 | 55.32725 | 25% |
| | Blue SOA EL spectrum | 0.37 | 0.24 | 0.39 | 56.0895 | 25% |
| Blue singlet, red and green triplet | Blue model | 0.59 | 0.2 | 0.21 | 129.77375 | 55.80% |
| | Blue SOA EL spectrum | 0.71 | 0.11 | 0.18 | 104.37775 | 46.70% |
| Exemplary embodiment of the invention | Blue model | 0.28 | 0.33 | 0.39 | 199.1781 | 89% |
| | Blue SOA EL spectrum | 0.37 | 0.24 | 0.39 | 179.4864 | 68% |
| Exclusively triplet emitters | Blue model | 0.28 | 0.33 | 0.39 | 221.309 | 100% |
| | Blue SOA EL spectrum | 0.37 | 0.24 | 0.39 | 224.358 | 100% |

The values from table 1 verify that the theoretical limit of white light generation on the basis of the invention is at least 90%. In the case of an even more favourable blue spectrum, it may, if appropriate, extend even closer to the upper limit of 100% which can be achieved in the case of pure light generation on triplet emitters.

Consequently, the invention makes it possible to increase the internal quantum efficiency for white light generation by means of electroluminescence when using a fluorescent blue emitter to above 65%, and in an improved embodiment to above 90%. This means a drastic increase in exciton utilization compared with conventional OLEDs on the basis of a fluorescent blue emitter and phosphorescent green and red emitters and also compared with purely fluorescent white OLEDs.

Exemplary embodiments of the OLEDs are described below in order to elucidate the invention further.

Figure 9:
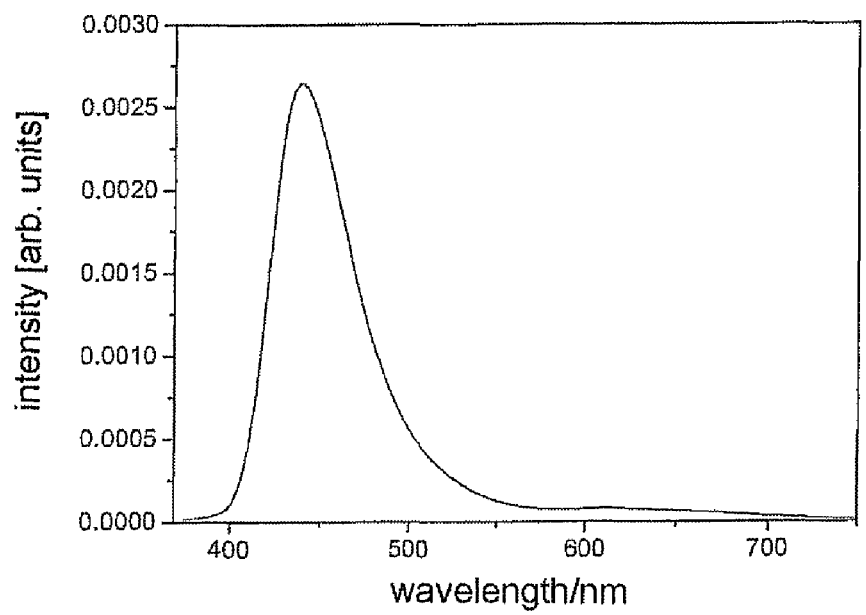
FIG. 9 shows an electroluminescence spectrum for an organic reference light-emitting diode.

Firstly, a reference OLED having the following layer arrangement was produced:
1) anode: indium tin oxide (ITO)
2) p-doped hole transport layer: 80 nm, 4,4',4"-tris(N,N-diphenylamino)triphenylamine (Starburst TDATA) doped with tetrafluoro-tetracyano-quinodimethane (F4-TCNQ)
3) hole-side intermediate layer: 10 nm N,N'-bis(3-methylphenyl)-N,N'-bis(phenyl)benzidine (TPD)
4) blue emission layer: 20 nm α-NPD
5) electron-side intermediate layer: 10 nm bathophenanthroline (Bphen)
6) n-doped electron transport layer: 30 nm Bphen doped with Cs
7) cathode: 100 nm aluminium This pin-OLED exhibits, in accordance with FIG. 9, a blue emission with a maximum at 440 nm. The sample has a current efficiency of 1.8 cd/A and a quantum efficiency of 1.5% at a brightness of 10,000 cd/m$^2$.

Figure 10:
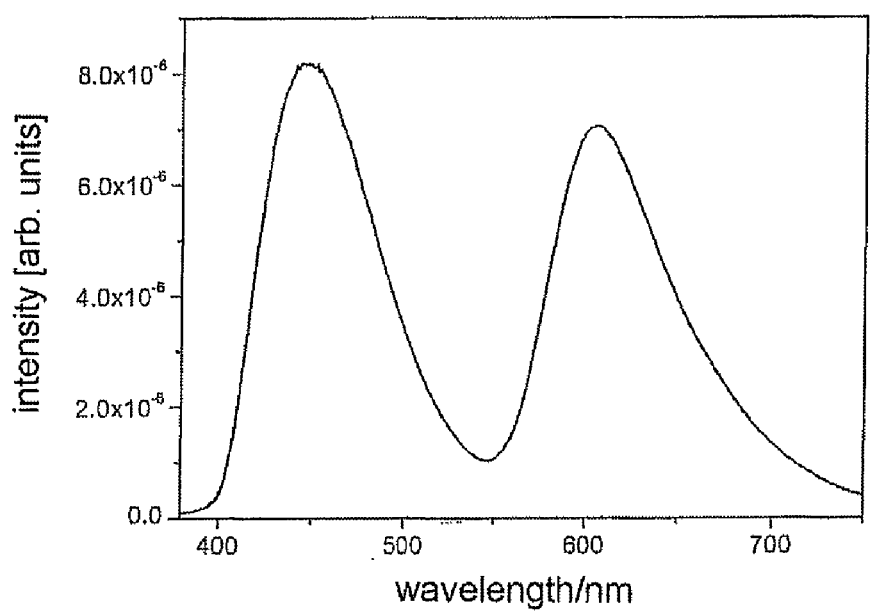
FIG. 10 shows an electroluminescence spectrum for a first organic light-emitting diode according to the invention.

A first exemplary embodiment of an OLED according to the invention provides the following layer structure:
1) anode: indium tin oxide (ITO)
2) p-doped hole transport layer: 80 nm, 4,4',4"-tris(N,N-diphenylamino)triphenylamine (Starburst TDATA) doped with tetrafluoro-tetracyano-quinodimethane (F4-TCNQ)
3) hole-side intermediate layer: 10 nm N,N'-bis(3-methylphenyl)-N,N'-bis(phenyl)benzidine (TPD)
4) orange-red emission layer: 10 nm bis[N-(1-naphthyl)-N-phenyl]benzidine (α-NPD) doped with iridium (III) bis(2-methyldibenzo[f,h]quinoxaline) (acetylacetonate)) (RE076,ADS)
5) blue emission layer: 20 nm α-NPD
6) electron-side intermediate layer: 10 nm bathophenanthroline (Bphen)
7) n-doped electron transport layer: 30 nm Bphen doped with Cs
8) cathode: 100 nm aluminium This OLED is a white pin-OLED which exhibits a brightness of above 10,000 cd/m$^2$ at a voltage of 6V. The electroluminescence spectrum has two peaks at 450 nm and 610 nm in accordance with FIG. 10. The CIE colour coordinates are x=0.33 and y=0.22. The sample has a current efficiency of 5.7 cd/A and a quantum efficiency of 4.2% at a brightness of 10,000 cd/m². Upon consideration of the electroluminescence spectrum of this OLED, both the emission of α-NPD and that of the orange-red emitter RE076 are clearly evident. FIG. 9 shows the spectrum of a pure emission of the α-NPD in comparison with this.

On account of the energetic position at the contract area of Bphen (HOMO ~−6.4 eV, LUMO ~−3.0 eV, He et al., Appl. Phys. Lett. 85(17), 3911 (2004)) and α-NPD (HOMO ~−5.7 eV, LUMO ~−2.6 eV, Baldo et al., Appl. Phys. Lett. 75(1), 4 (1999)), in this structure the recombination of holes and electrons is necessarily effected at this contact area. Therefore, initially only a blue singlet emission of the α-NPD is expected. In actual fact, however, a considerable red emission is furthermore also manifested as well. Furthermore, the sample exhibits a significantly higher current and quantum efficiency than the comparison sample without the emission layer with the phosphorescent emitter, which can be explained to this extent only by an efficient utilization of the triplet excitons formed at the Bphen/α-NPD interface by the red triplet emitter.

Figure 11:
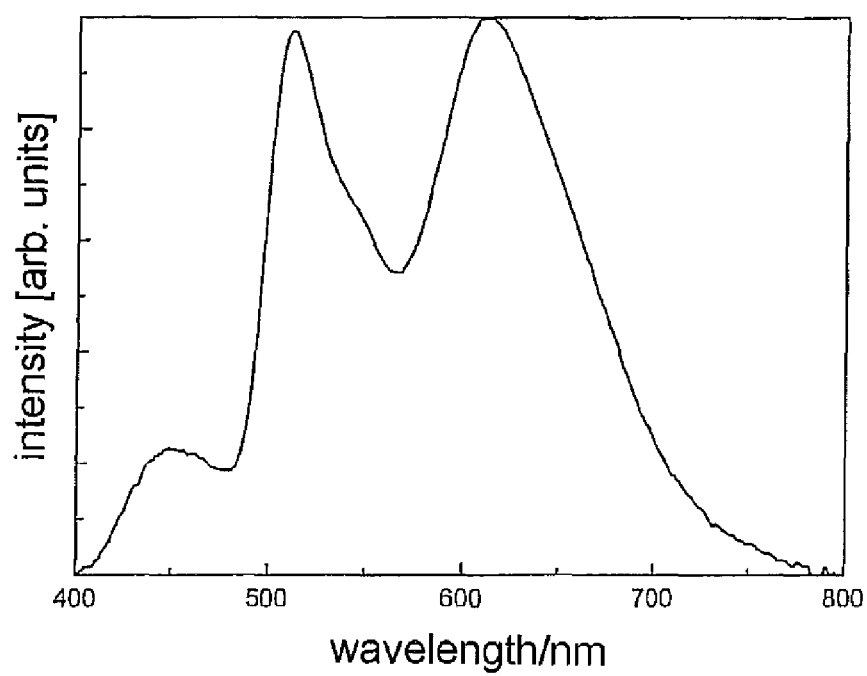
FIG. 11 shows an electroluminescence spectrum for a second organic light-emitting diode according to the invention.

A second exemplary embodiment of an OLED according to the invention provides the following layer structure:
1) anode: indium tin oxide (ITO)
2) p-doped hole transport layer: 60 nm, 4,4',4''-tris(N,N-diphenylamino)triphenylamine (Starburst TDATA) doped with tetrafluoro-tetracyano-quinodimethane (F4-TCNQ)
3) hole-side intermediate layer: 10 nm 2,2',7,7'tetrakis(N,N-diphenylamino)-9,9'-spirobifluorene (spiro-TAD)
4) orange-red emission layer: 10 nm bis[N-(1-naphthyl)-N-phenyl]benzidine (α-NPD) doped with iridium (III) bis(2-methyldibenzo[f,h]quinoxaline) (acetylacetonate) (RE076, ADS)
5) blue emission layer: 30 nm α-NPD
6) green emission layer: 1,3,5-Tri(phenyl-2-benzimidazole)benzene (TPBI) doped with fac-tris(2-phenylpyridine)iridium (Ir(ppy)₃)
7) electron-side intermediate layer: 10 nm bathophenanthroline (Bphen)
8) n-doped electron transport layer: 30 nm Bphen doped with Cs
9) cathode: 100 nm aluminium This OLED is a white pin-OLED which, in accordance with FIG. 11, exhibits an emission with colour coordinates of 0.42/0.44. The sample has a current efficiency of 11 cd/A at an operating voltage of 4.3V and a brightness of 2000 cd/m². In this structure, too, electrons and holes recombine predominantly in the α-NPD layer, in part also in the emission layer with the green emitter, since α-NPD is a hole transporter (cf. Kido et al., App. Phys. Lett. 73 (20), 2866 (1998)). While singlet excitons which are formed in the α-NPD decompose to radiate blue, the triplet excitons generated there diffuse into the adjacent emission layers (orange-red and green), where they decompose in part radiatively with emission of light having a longer wavelength.

The features of the invention which are disclosed in the above description, the claims and the drawings may be of importance both individually and in any desired combination for the realization of the invention in its various embodiments.

The invention claimed is:

1. A light-emitting component comprising an electrode and a counterelectrode and an organic region—arranged between the electrode and the counterelectrode—comprising a light-emitting organic region, which comprises an emission layer and a further emission layer and which, upon application of an electrical voltage to the electrode and the counterelectrode, emits light in a plurality of colour ranges in the visible spectral range, wherein:
the emission layer comprises a fluorescent emitter which emits light predominantly in the blue or in the blue-green spectral range; and the further emission layer comprises one or a plurality of phosphorescent emitters emitting light predominantly in the non-blue spectral range;
a triplet energy for an energy level of a triplet state of the fluorescent emitter in the emission layer is greater than a triplet energy for an energy level of a triplet state of the phosphorescent emitter in the further emission layer; and
the light-emitting organic region delivers an at least 5% proportion of the light generated in the visible spectral range as fluorescent light from singlet states of the fluorescent emitter in the emission layer.

2. The light-emitting component according to claim 1, wherein the light-emitting organic region delivers an at least 10% proportion of the light generated in the visible spectral range as fluorescent light of the singlet states of the fluorescent emitter in the emission layer.

3. The light-emitting component according to claim 1, wherein light generated in the light-emitting organic region delivers an at least 15% proportion of in the visible spectral range as fluorescent light of the singlet states of the fluorescent emitter in the emission layer.

4. The light-emitting component according to claim 1, wherein the light-emitting organic region delivers an at least 20% proportion of the light generated in the visible spectral range as fluorescent light of the singlet states of the fluorescent emitter in the emission layer.

5. The light-emitting component according to claim 1, wherein the light-emitting organic region delivers an at least 25% proportion of the light generated in the visible spectral range as fluorescent light of the singlet states of the fluorescent emitter in the emission layer.

6. The light-emitting component according to claim 1, wherein the emission layer and the further emission layer adjoin one another.

7. The light-emitting component according to claim 1, wherein the emission layer and the further emission layer transport holes, and in that a distance between a surface of the emission layer which faces the electrode formed as a cathode and a surface of the cathode which faces the emission layer is less than a distance between a surface of the further emission layer which faces the cathode and a surface of the cathode which faces the further emission layer.

8. The light-emitting component according to claim 1, wherein the emission layer and the further emission layer transport electrons, and in that a distance between a surface of the emission layer which faces the counter electrode formed as an anode and a surface of the anode which faces the emission layer is less than a distance between a surface of the further emission layer which faces the anode and a surface of the anode which faces the further emission layer.

9. The light-emitting component according to claim 1, wherein:
the light-emitting organic region comprises another emission layer having one or a plurality of phosphorescent emitters emitting light predominantly in the non-blue spectral range;
the emission layer is arranged between the further emission layer and the other emission layer;
the further emission layer transports electrons, a distance between a surface of the further emission layer which faces the cathode and a surface of the cathode which faces the further emission layer being less than a distance between a surface of the emission layer which faces the cathode and a surface of the cathode which faces the emission layer, and also a distance between a surface of the other emission layer which faces the cathode and a surface of the cathode which faces the other emission layer; and the other emission layer transports holes, a distance between a surface of the other emission layer which faces the anode and a surface of the anode which faces the other emission layer being less than a distance between a surface of the emission layer which faces the anode and a surface of the anode which faces the emission layer, and also a distance between a surface of the further emission layer which faces the anode and a surface of the anode which faces the further emission layer.

10. The light-emitting component according to claim 1, wherein a hole blocking layer is arranged between the emission layer and the cathode, the hole blocking layer transporting electrons and an organic material of the hole blocking layer having an HOMO level which is at least about 0.3 eV lower than an HOMO level of the fluorescent emitter in the emission layer.

11. The light-emitting component according claim 1, wherein an electron blocking layer is arranged between the emission layer and the anode, the electron blocking layer transporting holes and all organic material of the electron blocking layer having an LUMO level which is at least about 0.3 eV higher than an LUMO level of the fluorescent emitter in the emission layer.

12. The light-emitting component according to claim 10, wherein a minimum energy of singlet excitons and of triplet excitons in the hole blocking layer or in the electron blocking layer is greater than a minimum energy of singlet excitons and of triplet excitons in the emission layer.

13. The light-emitting component according to claim 9, wherein emission layer and/or the further emission layer and/or the other emission layer are formed in multilayer fashion.

14. The light-emitting component according to claim 1, wherein the emission layer has a thickness of between about 5 nm and about 50 nm.

15. The light-emitting component according to claim 1, wherein the light-emitting organic region emits white light, and the or all of the phosphorescent emitters in the further mission layer comprise emitters emitting light in the red, orange, or yellow spectral range.

16. The light-emitting component according to claim 1, wherein the light-emitting organic region emits white light, and the or all of the phosphorescent emitters in the further emission layer comprise emitters emitting light in the red, orange or green spectral range.

17. The light-emitting component according to claim 9, wherein the light-emitting organic region emits white light, and the or all of the phosphorescent emitters in the other emission layer comprise emitters emitting light in the red, orange, or yellow spectral range.

18. The light-emitting component according to claim 9, wherein the light-emitting organic region emits white light, and the or all of the phosphorescent emitters in the other emission layer comprise emitters emitting light in the red, orange or green spectral range.

19. The light-emitting component according to claim 1, wherein a respective doped organic layer is arranged between the organic light-emitting region and the electrode or between the organic light-emitting region and the counterelectrode.

20. The light-emitting component according to claim 19, wherein the respective doped organic layer comprises a layer which is p-doped with an acceptor material or a layer which is n-doped with a donor material.

21. The light-emitting component according to claim 1, wherein the fluorescent emitter in the emission layer comprises an organometallic compound or a complex compound with a metal having an ordinal number of less than about 40.

22. The light-emitting component according to claim 1, wherein the fluorescent emitter in the emission layer comprises an electron-attracting substituent selected from the group consisting of:
  a) halogens
  b) CN;
  c) halogenated or cyano-substituted alkanes or alkenes;
  d) halogenated or cyano-substituted aryl radicals; and
  e) boryl radicals.

23. The light-emitting component according to claim 1, wherein the fluorescent emitter in the emission layer comprises an electron-donating substituent selected from the group consisting of:
  a) alkyl radicals;
  b) alkoxy radicals;
  c) aryl radicals with or without substituents on the aryl; and
  d) amino groups.

24. The light-emitting component according to claim 1, wherein the fluorescent emitter in the emission layer comprises a functional group having an electron acceptor property selected from the group consisting of:
  a) oxadiazole;
  b) triazole;
  c) benzotliadiazoles;
  d) benzinidazoles and N-aryl-benzinidazoles;
  e) bipyridine;
  f) cyanoviily;
  g) quinolines;
  h) quinoxalines;
  i) triarylboryl;
  j) silol units;
  k) cyclooctatetraene;
  l) quinoid structures and ketones, including quinoid thiophene derivatives;
  m) pyrazolines:
  n) peiltaaryl cyclopentadiene;
  o) benzothiadiazoles;
  p) oligo-para-phenyl with electron-attracting substituents; and
  q) fluorenes and spiro-bifluorenes with electron-attracting substituents.

25. The light emitting component according to claim 1, wherein the fluorescent emitter in the emission layer comprises a functional group having an electron acceptor property selected from the group consisting of:
  a) triarylaillines;
  b) oligo-para-phenyl or oligo-meta-phenyl;
  c) carbazoles;
  d) fluorene or spiro-bifluorenes;
  e) phenylene-vinylene units;
  f) naphthalene:
  g) anthracene;
  h) peryleile;
  i) pyrene; and
  j) thiophene.

* * * * *